(12) United States Patent
Ohsugi et al.

(10) Patent No.: US 12,283,846 B2
(45) Date of Patent: Apr. 22, 2025

(54) STATOR CORE, ROTARY ELECTRIC MACHINE, AND DESIGN METHOD FOR STATOR CORE

(71) Applicant: NIPPON STEEL CORPORATION, Tokyo (JP)

(72) Inventors: Yasuo Ohsugi, Tokyo (JP); Miho Tomita, Tokyo (JP); Tesshu Murakawa, Tokyo (JP)

(73) Assignee: NIPPON STEEL CORPORATION, Tokyo (JP)

( * ) Notice: Subject to any disclaimer, the term of this patent is extended or adjusted under 35 U.S.C. 154(b) by 432 days.

(21) Appl. No.: 17/776,441

(22) PCT Filed: Nov. 13, 2020

(86) PCT No.: PCT/JP2020/042473
§ 371 (c)(1),
(2) Date: May 12, 2022

(87) PCT Pub. No.: WO2021/095861
PCT Pub. Date: May 20, 2021

(65) Prior Publication Data
US 2022/0407371 A1 Dec. 22, 2022

(30) Foreign Application Priority Data

Nov. 15, 2019 (JP) .................... 2019-206649

(51) Int. Cl.
*H02K 1/02* (2006.01)
*C22C 38/00* (2006.01)
*C22C 38/02* (2006.01)
*C22C 38/04* (2006.01)
*C22C 38/06* (2006.01)
*C22C 38/10* (2006.01)
(Continued)

(52) U.S. Cl.
CPC ........... *H02K 1/165* (2013.01); *C22C 38/001* (2013.01); *C22C 38/002* (2013.01); *C22C 38/02* (2013.01); *C22C 38/04* (2013.01); *C22C 38/06* (2013.01); *C22C 38/105* (2013.01); *C22C 38/16* (2013.01); *G06F 30/36* (2020.01); *H02K 1/02* (2013.01); *C22C 2202/02* (2013.01)

(58) Field of Classification Search
CPC ............ H02K 1/02; H02K 1/148; H02K 1/16; H02K 1/146; H02K 1/18; H02K 1/14; H02K 1/276; H02K 1/12; H02K 1/165; H02K 1/185; H02K 1/20
See application file for complete search history.

(56) References Cited

U.S. PATENT DOCUMENTS

2017/0237304 A1\* 8/2017 Okochi ................. H02K 1/146
310/216.069

FOREIGN PATENT DOCUMENTS

JP 59-10142 A 1/1984
JP 8-214476 A 8/1996
(Continued)

*Primary Examiner* — Bryan R Perez
(74) *Attorney, Agent, or Firm* — Birch, Stewart, Kolasch & Birch, LLP

(57) ABSTRACT

The present invention is a stator core having a plurality of laminated electrical steel sheets, in which, among a plurality of teeth (121a to 121p) of the stator core, a width of teeth along a direction in which magnetic characteristics are excellent may be narrower than a width of teeth along a direction in which the magnetic characteristics are poor.

18 Claims, 16 Drawing Sheets

(51) Int. Cl.
  *C22C 38/16* (2006.01)
  *G06F 30/36* (2020.01)
  *H02K 1/16* (2006.01)

(56) References Cited

FOREIGN PATENT DOCUMENTS

| JP | 2002-320350 A | 10/2002 |
| JP | 2005-269746 A | 9/2005 |
| JP | 2019-178380 A | 10/2019 |

* cited by examiner (a)

(b)

| TORQUE PROPORTION [%] | AVERAGE MANGETIC FLUX DENSITY OF TEETH [T$^{peak}$] |
|---|---|
| 20 | 1.22 |
| 40 | 1.44 |
| 60 | 1.59 |
| 80 | 1.82 |
| 100 | 2.04 |

FIG. 7

(MATERIAL A)

| TORQUE PROPORTION [%] | ANGLE FROM ROLLING DIRECTION [°] | | | | |
|---|---|---|---|---|---|
| | 0° | 22.5° | 45° | 67.5° | 90° |
| 20 | 1.33 [T] | 1.28 [T] | 1.20 [T] | 1.18 [T] | 1.13 [T] |
| 40 | 1.51 [T] | 1.47 [T] | 1.42 [T] | 1.42 [T] | 1.44 [T] |
| 60 | 1.65 [T] | 1.61 [T] | 1.55 [T] | 1.56 [T] | 1.59 [T] |
| 80 | 1.84 [T] | 1.82 [T] | 1.80 [T] | 1.81 [T] | 1.82 [T] |
| 100 | 2.04 [T] | 2.04 [T] | 2.04 [T] | 2.04 [T] | 2.04 [T] |

FIG. 8

(MATERIAL A)

| TORQUE PROPORTION [%] | ANGLE FROM ROLLING DIRECTION [°] | | | | |
|---|---|---|---|---|---|
| | 0° | 22.5° | 45° | 67.5° | 90° |
| 20 | 5.40 [mm] | 5.58 [mm] | 5.96 [mm] | 6.08 [mm] | 6.32 [mm] |
| 40 | 5.57 [mm] | 5.72 [mm] | 5.95 [mm] | 5.93 [mm] | 5.85 [mm] |
| 60 | 5.64 [mm] | 5.76 [mm] | 5.99 [mm] | 5.96 [mm] | 5.85 [mm] |
| 80 | 5.79 [mm] | 5.83 [mm] | 5.90 [mm] | 5.89 [mm] | 5.85 [mm] |
| 100 | 5.86 [mm] | 5.86 [mm] | 5.86 [mm] | 5.86 [mm] | 5.86 [mm] |

FIG. 9

(MATERIAL A)

| TORQUE PROPORTION [%] | IRON LOSS PROPORTION [-] |
|---|---|
| 20 | 0.996 |
| 40 | 0.987 |
| 60 | 0.999 |
| 80 | 0.999 |
| 100 | 1.000 |

FIG. 10

| TORQUE PROPORTION [%] | OPERATING TIME PROPORTION [%] |
|---|---|
| 0~30 | 20 |
| 30~50 | 45 |
| 50~70 | 20 |
| 70~90 | 10 |
| 90~100 | 5 |

FIG. 11

(MATERIAL A)

| ANGLE FROM ROLLING DIRECTION [°] | 0° | 22.5° | 45° | 67.5° | 90° |
|---|---|---|---|---|---|
| TEETH WIDTH [mm] | 5.58 | 5.72 | 5.95 | 5.96 | 5.95 |

FIG. 12

(MATERIAL B)

| TORQUE PROPORTION [%] | ANGLE FROM ROLLING DIRECTION [°] | | | | |
|---|---|---|---|---|---|
|  | 0° | 22.5° | 45° | 67.5° | 90° |
| 20 | 1.15 [T] | 1.23 [T] | 1.33 [T] | 1.27 [T] | 1.12 [T] |
| 40 | 1.40 [T] | 1.50 [T] | 1.60 [T] | 1.47 [T] | 1.33 [T] |
| 60 | 1.52 [T] | 1.63 [T] | 1.72 [T] | 1.61 [T] | 1.45 [T] |
| 80 | 1.73 [T] | 1.84 [T] | 1.90 [T] | 1.83 [T] | 1.69 [T] |
| 100 | 2.04 [T] | 2.04 [T] | 2.04 [T] | 2.04 [T] | 2.04 [T] |

FIG. 13

(MATERIAL B)

| TORQUE PROPORTION [%] | ANGLE FROM ROLLING DIRECTION [°] | | | | |
|---|---|---|---|---|---|
| | 0° | 22.5° | 45° | 67.5° | 90° |
| 20 | 6.21 [mm] | 5.83 [mm] | 5.40 [mm] | 5.63 [mm] | 6.42 [mm] |
| 40 | 6.00 [mm] | 5.61 [mm] | 5.27 [mm] | 5.74 [mm] | 6.33 [mm] |
| 60 | 6.13 [mm] | 5.71 [mm] | 5.40 [mm] | 5.79 [mm] | 6.40 [mm] |
| 80 | 6.15 [mm] | 5.79 [mm] | 5.59 [mm] | 5.82 [mm] | 6.29 [mm] |
| 100 | 5.86 [mm] | 5.86 [mm] | 5.86 [mm] | 5.86 [mm] | 5.86 [mm] |

FIG. 14

(MATERIAL B)

| TORQUE PROPORTION [%] | IRON LOSS PROPORTION [-] |
|---|---|
| 20 | 0.968 |
| 40 | 0.936 |
| 60 | 0.968 |
| 80 | 0.994 |
| 100 | 1.000 |

FIG. 15

(MATERIAL B)

| ANGLE FROM ROLLING DIRECTION [°] | 0° | 22.5° | 45° | 67.5° | 90° |
|---|---|---|---|---|---|
| TEETH WIDTH [mm] | 6.08 | 5.71 | 5.38 | 5.74 | 6.34 |

| TORQUE PROPORTION [%] | AVERAGE MAGNETIC FLUX DENSITY OF TEETH [$T^{peak}$] |
|---|---|
| 20 | 1.42 |
| 40 | 1.63 |
| 60 | 1.69 |
| 80 | 1.79 |
| 100 | 1.92 |

FIG. 19

(MATERIAL A)

| TORQUE PROPORTION [%] | ANGLE FROM ROLLING DIRECTION [°] | | | | |
|---|---|---|---|---|---|
| | 0° | 22.5° | 45° | 67.5° | 90° |
| 20 | 1.50 [T] | 1.45 [T] | 1.41 [T] | 1.41 [T] | 1.42 [T] |
| 40 | 1.70 [T] | 1.65 [T] | 1.60 [T] | 1.61 [T] | 1.63 [T] |
| 60 | 1.75 [T] | 1.71 [T] | 1.66 [T] | 1.66 [T] | 1.70 [T] |
| 80 | 1.82 [T] | 1.80 [T] | 1.77 [T] | 1.77 [T] | 1.80 [T] |
| 100 | 1.93 [T] | 1.92 [T] | 1.91 [T] | 1.92 [T] | 1.92 [T] |

FIG. 20

(MATERIAL A)

| TORQUE PROPORTION [%] | ANGLE FROM ROLLING DIRECTION [°] | | | | |
|---|---|---|---|---|---|
| | 0° | 22.5° | 45° | 67.5° | 90° |
| 20 | 3.79 [mm] | 3.92 [mm] | 4.05 [mm] | 4.04 [mm] | 4.00 [mm] |
| 40 | 3.84 [mm] | 3.94 [mm] | 4.07 [mm] | 4.05 [mm] | 3.99 [mm] |
| 60 | 3.85 [mm] | 3.96 [mm] | 4.08 [mm] | 4.06 [mm] | 3.96 [mm] |
| 80 | 3.92 [mm] | 3.97 [mm] | 4.05 [mm] | 4.04 [mm] | 3.97 [mm] |
| 100 | 3.98 [mm] | 3.99 [mm] | 4.01 [mm] | 4.01 [mm] | 4.00 [mm] |

FIG. 21

(MATERIAL A)

| TORQUE PROPORTION [%] | IRON LOSS PROPORTION [-] |
|---|---|
| 20 | 0.986 |
| 40 | 0.996 |
| 60 | 0.999 |
| 80 | 0.999 |
| 100 | 1.000 |

FIG. 22

(MATERIAL A)

| ANGLE FROM ROLLING DIRECTION [°] | 0° | 22.5° | 45° | 67.5° | 90° |
|---|---|---|---|---|---|
| TEETH WIDTH [mm] | 3.85 | 3.95 | 4.06 | 4.05 | 3.98 |

FIG. 23

(MATERIAL B)

| TORQUE PROPORTION [%] | ANGLE FROM ROLLING DIRECTION [°] | | | | |
|---|---|---|---|---|---|
| | 0° | 22.5° | 45° | 67.5° | 90° |
| 20 | 1.38 [T] | 1.47 [T] | 1.57 [T] | 1.45 [T] | 1.32 [T] |
| 40 | 1.55 [T] | 1.67 [T] | 1.76 [T] | 1.64 [T] | 1.49 [T] |
| 60 | 1.60 [T] | 1.72 [T] | 1.81 [T] | 1.70 [T] | 1.54 [T] |
| 80 | 1.70 [T] | 1.81 [T] | 1.90 [T] | 1.80 [T] | 1.65 [T] |
| 100 | 1.87 [T] | 1.92 [T] | 1.93 [T] | 1.92 [T] | 1.87 [T] |

FIG. 24

(MATERIAL B)

| TORQUE PROPORTION [%] | ANGLE FROM ROLLING DIRECTION [°] | | | | |
|---|---|---|---|---|---|
| | 0° | 22.5° | 45° | 67.5° | 90° |
| 20 | 4.11 [mm] | 3.86 [mm] | 3.62 [mm] | 3.93 [mm] | 4.32 [mm] |
| 40 | 4.21 [mm] | 3.90 [mm] | 3.70 [mm] | 3.96 [mm] | 4.36 [mm] |
| 60 | 4.22 [mm] | 3.92 [mm] | 3.73 [mm] | 3.97 [mm] | 4.38 [mm] |
| 80 | 4.22 [mm] | 3.94 [mm] | 3.77 [mm] | 3.97 [mm] | 4.34 [mm] |
| 100 | 4.10 [mm] | 3.99 [mm] | 3.97 [mm] | 3.99 [mm] | 4.10 [mm] |

FIG. 25

(MATERIAL B)

| TORQUE PROPORTION [%] | IRON LOSS PROPORTION [-] |
|---|---|
| 20 | 0.944 |
| 40 | 0.973 |
| 60 | 0.981 |
| 80 | 0.989 |
| 100 | 1.000 |

(MATERIAL B)

| ANGLE FROM ROLLING DIRECTION [°] | 0° | 22.5° | 45° | 67.5° | 90° |
|---|---|---|---|---|---|
| TEETH WIDTH [mm] | 4.18 | 3.91 | 3.71 | 3.96 | 4.34 |

STATOR CORE, ROTARY ELECTRIC MACHINE, AND DESIGN METHOD FOR STATOR CORE

TECHNICAL FIELD OF THE INVENTION

The present invention relates to a stator core, a rotary electric machine, and a design method for a stator core. In particular, the present invention is suitable for use in a stator core having a plurality of laminated electrical steel sheets.

Priority is claimed on Japanese Patent Application No. 2019-206649, filed in Japan on Nov. 15, 2019, the content of which is incorporated herein by reference.

RELATED ART

Electrical steel sheets are mainly used as stator cores (iron cores) of rotary electric machines. Electrical steel sheets are roughly classified into grain-oriented electrical steel sheets and non-oriented electrical steel sheets. The magnetic characteristics of electrical steel sheets are generally anisotropic in the sheet surfaces. In particular, grain-oriented electrical steel sheets have a large anisotropy of magnetic characteristics, and the magnetic characteristics in a rolling direction are extremely more favorable than those in other directions. On the other hand, even non-oriented electrical steel sheets have an anisotropy of magnetic characteristics while the degree of the anisotropy is smaller than that of grain-oriented electrical steel sheets. When electrical steel sheets having such an anisotropy of magnetic characteristics are laminated to configure a stator core, a portion having favorable magnetic characteristics and a portion having poor magnetic characteristics are formed, and the distribution of the magnetic characteristics of the stator core varies. Specifically, the magnetic flux density in the stator core varies, and the iron loss becomes large.

Patent Document 1 discloses a technique of a rotary electric machine in which the path dimension for magnetic flux between the groove bottom and the outer circumference of a stator core (that is, the radical length of a yoke in the stator core) is made small in a region where the magnetic characteristics are favorable and large in a region where the magnetic characteristics are poor. In the technique of the rotary electric machine disclosed in Patent Document 1, the cross-sectional area of the yoke in the stator core is varied depending on the magnetic characteristics, whereby the magnetic flux density of the same magnetic flux is made as low as that in the region where the magnetic characteristics are poor.

Patent Document 2 discloses a technique of a three magnetic pole core in which the surface area of magnetic pole teeth in a rolling direction or a direction along an orthogonal-to-rolling direction is made smaller than the surface area of the other magnetic pole teeth. In the three magnetic pole core disclosed in Patent Document 2, the surface area of the magnetic pole teeth in the rolling direction or the direction along the orthogonal-to-rolling direction is made smaller than the surface area of the other magnetic pole teeth, which makes the three magnetic pole core inexpensive and makes it possible to eliminate the imbalance in the magnetic flux.

PRIOR ART DOCUMENT

Patent Document

[Patent Document 1] Japanese Unexamined Patent Application, First Publication No. S59-10142

[Patent Document 2] Japanese Unexamined Patent Application, First Publication No. H8-21447

DISCLOSURE OF THE INVENTION

Problems to be Solved by the Invention

However, in the technique disclosed in Patent Document 1, since magnetic flux flows from the teeth into the yoke while curving, it is not easy to specify which part of the yoke in the circumferential direction to increase or decrease the path dimension. That is, in the technique of Patent Document 1, it is difficult to determine the shape of the stator core, and there is a concern that it may not be possible to reduce the variation in the magnetic flux density.

In addition, in the technique disclosed in Patent Document 2, it is assumed that magnetic flux in the rolling direction or the direction along the orthogonal-to-rolling direction easily flows compared with the magnetic flux in the other directions, but there is a case where the flow of the magnetic flux in the rolling direction or the direction along the orthogonal-to-rolling direction is difficult. That is, even when the shape of the three magnetic pole core is determined based on the rolling direction as in the technique of Patent Document 2, there is a concern that it may not be possible to reduce the variation in the magnetic flux density.

The present invention has been made in view of the above-described problems, and an object of the present invention is to reduce a variation in the magnetic flux density to suppress the iron loss.

Means for Solving the Problem

In order to solve the above-described problems, the present invention employs the following configurations.

(1) A stator core according to one aspect of the present invention is a stator core having a plurality of laminated electrical steel sheets, in which, among a plurality of teeth of the stator core, widths of teeth along a direction in which magnetic characteristics are excellent are narrower than widths of teeth along a direction in which the magnetic characteristics are poor.

(2) The stator core according to (1) above, in which, in the teeth of the stator core, a product of the width of the tooth of the stator core and a magnetic flux density in the tooth when the stator core is excited with a predetermined magnetic field strength may be substantially constant in each tooth.

(3) The stator core according to (1) or (2) above, in which the stator core may be configured by laminating rolled electrical steel sheets, the electrical steel sheet may have a chemical composition containing, by mass %, C: 0.0100% or less, Si: 1.50% to 4.00%, sol. Al: 0.0001% to 1.0%, S: 0.0100% or less, N: 0.0100% or less, one or more selected from the group consisting of Mn, Ni, Co, Pt, Pb, Cu and Au: 2.50% to 5.00% in total, Sn: 0.000% to 0.400%, Sb: 0.000% to 0.400%, P: 0.000% to 0.400%, and one or more selected from the group consisting of Mg, Ca, Sr, Ba, Ce, La, Nd, Pr, Zn and Cd: 0.0000% to 0.0100% in total, in which, when a Mn content (mass %) is indicated by [Mn], a Ni content (mass %) is indicated by [Ni], a Co content (mass %) is indicated by [Co], a Pt content (mass %) is indicated by [Pt], a Pb content (mass %) is indicated by [Pb], a Cu content (mass %) is indicated by [Cu], an Au content (mass %) is indicated by [Au], a Si content (mass %) is indicated by [Si], and a sol. Al content (mass %) is indicated by [sol. Al], Formula (1) below is satisfied, a remainder includes Fe and impurities, when a value of B50 in a rolling direction is indicated by B50L, a value of B50 in a direction inclined by 45° from the rolling direction is indicated by B50D1, a value of B50 in a direction inclined by 90° from the rolling direction is indicated by B50C, and a value of B50 in a direction inclined by 135° from the rolling direction is indicated by B50D2, Formula (2) and Formula (3) below may be satisfied, an X-ray random intensity ratio in {100}<011> may be 5 or more and less than 30, and a sheet thickness may be 0.50 mm or less, the direction in which the magnetic characteristics are excellent may be a direction at an angle of 45° from the rolling direction, and the direction in which the magnetic characteristics are poor may be directions at angle of 0° and 90° from the rolling direction, and widths of teeth along a direction at an angle of 45° from the rolling direction may be narrower than widths of teeth along a direction at an angle of 0° from the rolling direction and widths of teeth along a direction at an angle of 90° from the rolling direction.

$$([Mn]+[Ni]+[Co]+[Pt]+[Pb]+[Cu]+[Au])-([Si]+[sol.Al])>0\% \quad (1)$$

$$(B50D1+B50D2)/2>1.7T \quad (2)$$

$$(B50D1+B50D2)/2>(B50L+B50C)/2 \quad (3)$$

Here, the magnetic flux density B50 refers to a magnetic flux density when the tooth is excited with a magnetic field strength of 5000 A/m.

(4) The stator core according to (3) above, in which Formula (4) below may be satisfied.

$$(B50D1+B50D2)/2>1.1\times(B50L+B50C)/2 \quad (4)$$

(5) The stator core according to (3) above, in which Formula (5) below may be satisfied.

$$(B50D1+B50D2)/2>1.2\times(B50L+B50C)/2 \quad (5)$$

(6) The stator core according to (3) above, in which Formula (6) below may be satisfied.

$$(B50D1+B50D2)/2>1.8T \quad (6)$$

(7) A rotary electric machine according to one aspect of the present invention includes the stator core according to any one of (1) to (6) above.

(8) A design method for a stator core according to one aspect of the present invention is a design method for a stator core having laminated electrical steel sheets, the method having a teeth magnetic flux density acquisition step of acquiring information on magnetic flux densities in teeth when excited with a predetermined magnetic field strength and a determination step of determining widths of the teeth of the stator core such that a product of the width of the tooth of the stator core and the magnetic flux density in the tooth acquired in the teeth magnetic flux density acquisition step becomes substantially constant in each tooth.

(9) The design method for a stator core according to (8) above, the method further having an operation data acquisition step of acquiring operation data of a rotary electric machine including the stator core in a case where the rotary electric machine is operated, a specifying step of specifying an operating condition having a highest proportion of an operating time among a plurality of operating conditions based on the operation data acquired in the operation data acquisition step, an average magnetic flux density acquisition step of acquiring information on an average magnetic flux density in the tooth corresponding to the operating condition having the highest proportion specified in the specification step, and an average magnetic field strength calculation step of calculating an average magnetic field strength in the tooth from the information on the average magnetic flux density in the tooth acquired in the average magnetic flux density acquisition step, in which, in the teeth magnetic flux density acquisition step, information on magnetic flux densities in the teeth when excited with the average magnetic field strength calculated in the average magnetic field strength calculation step may be acquired.

(10) The design method for a stator core according to (8) above, the method further having an operation data acquisition step of acquiring operation data of a rotary electric machine including the stator core in a case where the rotary electric machine is operated, a specification step of specifying a proportion of an operating time for each of a plurality of operating conditions based on the operation data acquired in the operation data acquisition step, an average magnetic flux density acquisition step of acquiring information on an average magnetic flux density in the tooth corresponding to each of the plurality of operating conditions, and an average magnetic field strength calculation step of calculating an average magnetic field strength in the tooth for each of the plurality of operating conditions from the information on the average magnetic flux density in the tooth corresponding to each of the plurality of operating conditions acquired in the average magnetic flux density acquisition step, in which, in the teeth magnetic flux density acquisition step, information on magnetic flux densities in the teeth for each of the plurality of operating conditions when excited with the average magnetic field strength for each of the plurality of operating conditions calculated in the average magnetic field strength calculation step may be acquired, in the determination step, the widths of the teeth may be calculated for each of the plurality of operating conditions such that the product of the width of the tooth of the stator core and the magnetic flux density in the tooth acquired in the teeth magnetic flux density acquisition step becomes substantially constant in each tooth, and the calculated widths of the teeth for each of the plurality of operating conditions may be weighted based on the proportions of the operating times specified in the specification step to determine widths of the teeth after weighting.

(11) The design method for a stator core according to (8) above, the method further having an operation data acquisition step of acquiring operation data of a rotary electric machine including the stator core in a case where the rotary electric machine is operated, a specifying step of specifying a proportion of an operating time for each of a plurality of operating conditions based on the operation data acquired in the operation data acquisition step, an average magnetic flux density acquisition step of acquiring information on an average magnetic flux density in the tooth corresponding to each of the plurality of operating conditions, an evaluation magnetic flux density calculation step of calculating an evaluation magnetic flux density in the tooth weighted based on the proportion of the operating time specified in the specification step from the information on the average magnetic flux density in the tooth corresponding to each of the plurality of operating conditions acquired in the average magnetic flux density acquisition step, and an average magnetic field strength calculation step of calculating an average magnetic field strength in the tooth from the evaluation magnetic flux density of the tooth calculated in the evaluation magnetic flux density calculation step, in which, in the teeth magnetic flux density acquisition step, information on magnetic flux densities in the teeth when excited with the average magnetic field strength in the teeth calculated in the average magnetic field strength calculation step may be acquired.

(12) The design method for a stator core according to any one of (9) to (11) above, in which, in the operation date acquisition step, at least any operation data of planned data and actual data of the rotary electric machine including the stator core may be acquired.

Effects of the Invention

According to the above-described aspect of the present invention, it is possible to reduce a variation in the magnetic flux density to suppress the iron loss.

BRIEF DESCRIPTION OF THE DRAWINGS

FIG. 7 is a table showing a relationship between the torque proportion and a magnetic flux density in the tooth at each angle from the rolling direction (material A).

FIG. 8 is a table showing a relationship between the torque proportion and an optimum width of the tooth at each angle from the rolling direction (material A).

FIG. 9 is a table showing an iron loss proportion between a comparative example and an invention example (material A).

FIG. 10 is a table showing an example of operation data.

FIG. 11 is a table showing the width of the tooth weighted based on the proportion of the operating time at each angle from the rolling direction (material A).

FIG. 12 is a table showing a relationship between the torque proportion and a magnetic flux density in the teeth at each angle from the rolling direction (material B).

FIG. 13 is a table showing a relationship between the torque proportion and an optimum width of the tooth at each angle from the rolling direction (material B).

FIG. 14 is a table showing an iron loss proportion between a comparative example and an invention example (material B).

FIG. 15 is a table showing the widths of the teeth weighted based on the proportion of the operating time at each angle from the rolling direction (material B).

FIG. 19 is a table showing a relationship between the torque proportion and a magnetic flux density in the tooth at each angle from the rolling direction (material A).

FIG. 20 is a table showing a relationship between the torque proportion and an optimum width of the tooth at each angle from the rolling direction (material A).

FIG. 21 is a table showing an iron loss proportion between a comparative example and an invention example (material A).

FIG. 22 is a table showing the width of the tooth weighted based on the proportion of the operating time at each angle from the rolling direction (material A).

FIG. 23 is a table showing a relationship between the torque proportion and a magnetic flux density in the teeth at each angle from the rolling direction (material B).

FIG. 24 is a table showing a relationship between the torque proportion and an optimum width of the tooth at each angle from the rolling direction (material B).

FIG. 25 is a table showing an iron loss proportion between a comparative example and an invention example (material B).

EMBODIMENTS OF THE INVENTION

Hereinafter, an embodiment of the present invention will be described with reference to the drawings. The X-Y-Z coordinates shown in each drawing indicate orientation relationships in each drawing, and the origin of the X-Y-Z coordinates is not limited to a position shown in each drawing. In addition, in the following description, the expression "lengths, shapes, directions, sizes, intervals, and other physical quantities are the same as each other" means that lengths, shapes, directions, sizes, intervals, and other physical quantities are not only completely the same as each other, but are also different from each other to an extent that the function of a portion of interest is not impaired.

<Configuration of Rotary Electric Machine>

Figure 1:
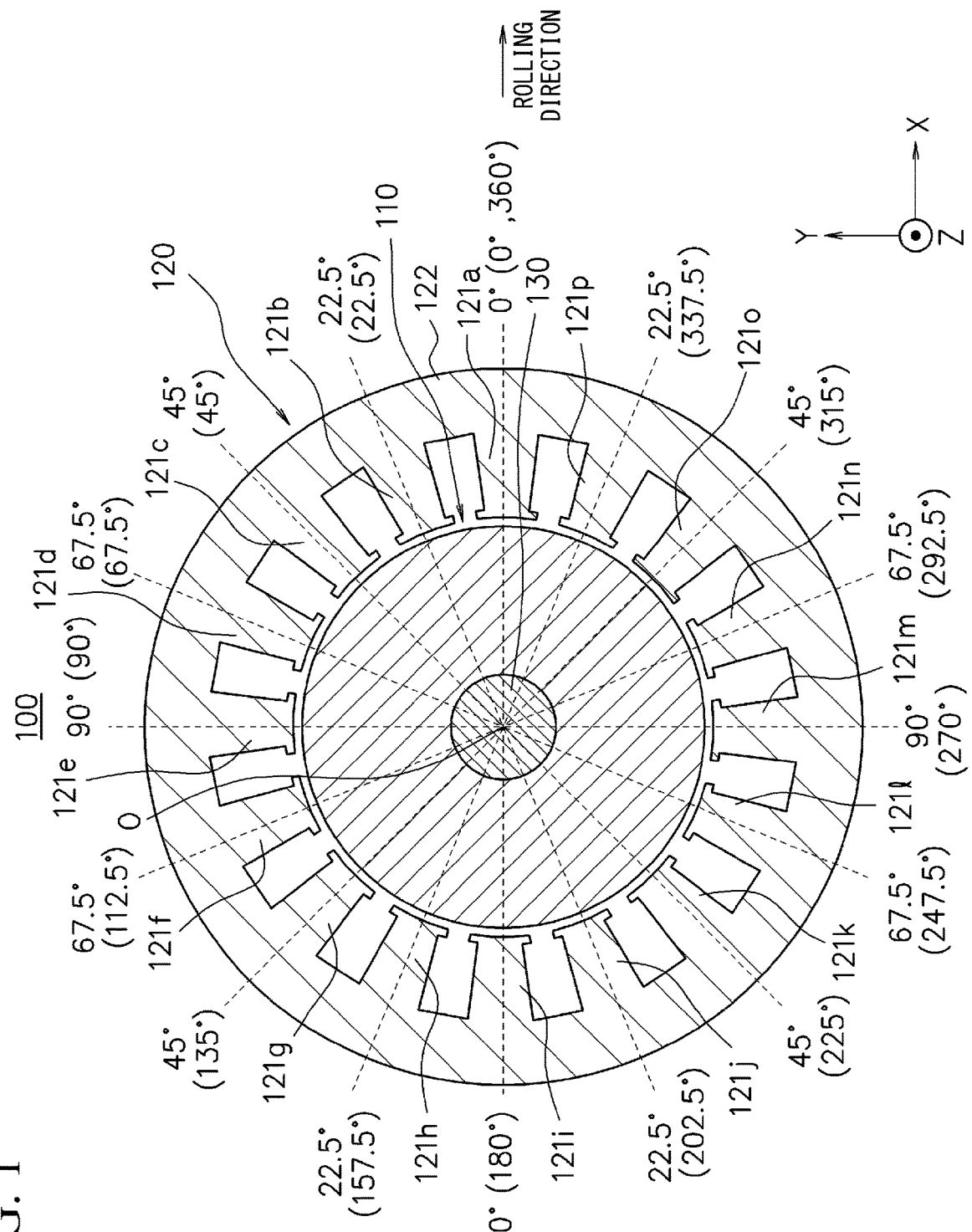
FIG. 1 is a view showing an example of the configuration of a rotary electric machine.

FIG. 1 is a view showing an example of the configuration of a rotary electric machine 100. Specifically, FIG. 1 is a view showing a cross section of the rotary electric machine 100 cut perpendicular to an axis O thereof. In the following description, the circumferential direction (a direction around the axis O of the rotary electric machine 100), the radial direction (a direction extending radially from the axis O of the rotary electric machine 100), and the height direction (a direction parallel to the axis O (Z-axis direction)) of the rotary electric machine 100 will be each abbreviated as the circumferential direction, the radial direction, and the height direction as necessary. In addition, the axis O of the rotary electric machine 100 is abbreviated as the axis O as necessary.

In FIG. 1, the rotary electric machine 100 has a rotor 110 and a stator 120.

The rotor 110 is attached to a rotating shaft 130 directly or via a member so as to be concentric with the rotating shaft 130 (axis O). The rotor 110 has, for example, a rotor core (iron core), a permanent magnet, and a rotating shaft (shaft). The rotor 110 can be realized by a well-known technique and thus will not be described in detail.

The stator 120 is disposed outside the rotor 110 so as to be concentric with the rotating shaft 130 (axis O). The stator 120 has a stator core and a coil. For ease of expression, in FIG. 1, the coil is not shown. The stator core has a plurality of teeth 121a to 121p and a yoke 122. The yoke 122 has a substantially hollow cylindrical shape. The teeth 121a to 121p radially extend from the inner circumferential surface of the yoke 122 toward the axis O. The teeth 121a to 121p are disposed at equal intervals in the circumferential direction. The teeth 121a to 121p and the yoke 122 are integrated with each other. That is, there is no boundary line between the teeth and the yoke. In addition, a boundary line that is present in the yoke in the case of a so-called split core is also not present.

The positions of the rotor 110 and the stator 120 are determined such that the tip end surfaces of the plurality of teeth 121a to 121p faces the outer circumferential surface of the rotor core of the rotor 110 with an interval (air gap) therebetween. In addition, the coil (winding) is disposed against each of the plurality of teeth 121a to 121p in a state of being electrically insulated from the teeth 121a to 121p. A method of coiling the coil may be distributed coiling or concentrated coiling. The flow of an exciting current in the coil of the stator 120 generates a rotating magnetic field and rotates the rotor 110 by the rotating magnetic field.

Here, a case where the rotary electric machine 100 is an inner rotor-type motor (electric motor) will be described as an example. Motors are applicable to, for example, electric vehicles, hybrid electric vehicles, and compressors, and where the motors are applicable is not particularly limited.

In the present embodiment, the stator core is configured using a non-oriented electrical steel sheet as an example of an electrical steel sheet. As the non-oriented electrical steel sheet, for example, a non-oriented electrical steel sheet that conforms to "non-oriented electrical steel strip" regulated in JIS C 2552 (2014) is used.

As the non-oriented electrical steel sheet cut out in accordance with the overall shape of the plane of the stator core (the shape shown in FIG. 1), a plurality of non-oriented electrical steel sheets having the same shape and size is laminated and fixed, whereby the stator core is configured. The stator core is fixed using, for example, a swage. A method for cutting out the non-oriented electrical steel sheet is not particularly limited. For example, the non-oriented electrical steel sheet can be cut out using blanking with a die, wire discharging, or the like.

In FIG. 1, for ease of description below, two types of angles will be expressed. Angles shown without parentheses in FIG. 1 (0°, 22.5°, 45°, 67.5°, and 90°) are angles that are 90° or less among angles that are formed by a rolling direction of the non-oriented electrical steel sheet and the radial directions of the teeth 121a to 121p with respect to the rolling direction of the non-oriented electrical steel sheet as a reference. Angles shown in parentheses in FIG. 1 (0°, 22.5°, 45°, 67.5°, 90°, 112.5°, 135°, 157.5°, 180°, 202.5°, 225°, 247.5°, 270°, 292.5°, 315°, 337.5°, and 360°) are angles with respect to, between the rolling directions of the non-oriented electrical steel sheet, the rolling direction in the positive direction of the X-axis as a reference (0 [°]) that are expressed with an assumption that the counterclockwise direction in FIG. 1 is regarded as the positive direction. As described above, in FIG. 1, the angles shown without parentheses and the following angles shown in parentheses are expressed in different manners, but have the same meaning.

Here, the radial directions of the teeth 121a to 121p are directions parallel to directions in which imaginary lines (straight lines shown by broken lines in FIG. 1) that pass through the centers of the teeth 121a to 121p in the circumferential direction and the axis O and are elongated parallel to a plane (X-Y plane) perpendicular to the axis O (the axis of the stator core). In FIG. 1, a case where the rolling direction of the non-oriented electrical steel sheet is the X-axis direction will be shown as an example.

In the following description, the angles that are formed by the rolling direction of the non-oriented electrical steel sheet and the radial directions of the teeth 121a to 121p with respect to the rolling direction of the non-oriented electrical steel sheet as the reference will be referred to as angles from the rolling direction as necessary. In the following description, for ease of description, the angles from the rolling direction will be described as angles defined as the angles shown without parentheses in FIG. 1 or as angles defined as the angles shown in parentheses in FIG. 1 depending on the situation. However, as described above, the angles shown without parentheses and the following angles shown in parentheses are expressed in different manners, but have the same meaning.

In the present embodiment, the plurality of non-oriented electrical steel sheets cut out as described above are laminated in a state where the angles from the rolling direction are aligned. That is, among regions of the plurality of non-oriented electrical steel sheet cut out as described above, regions that belong to the same tooth have the same angle from the rolling direction (in the case of being expressed as an angle defined as the angles shown without parentheses in FIG. 1).

In the present embodiment, a case where stator cores are configured using two types of non-oriented electrical steel sheets having magnetic characteristics that vary depending on the angles from the rolling direction (a first non-oriented electrical steel sheet (referred to as the material A) for one and a second non-oriented electrical steel sheet (referred to as the material B) for the other) will be described.

The material A is a steel sheet in which the magnetic characteristics are most favorable in a direction at an angle of 0° from the rolling direction and an anisotropy is relatively small. The material B is a steel sheet in which the magnetic characteristics are most favorable in a direction at an angle of 45° from the rolling direction and an anisotropy is relatively large.

Figure 2:
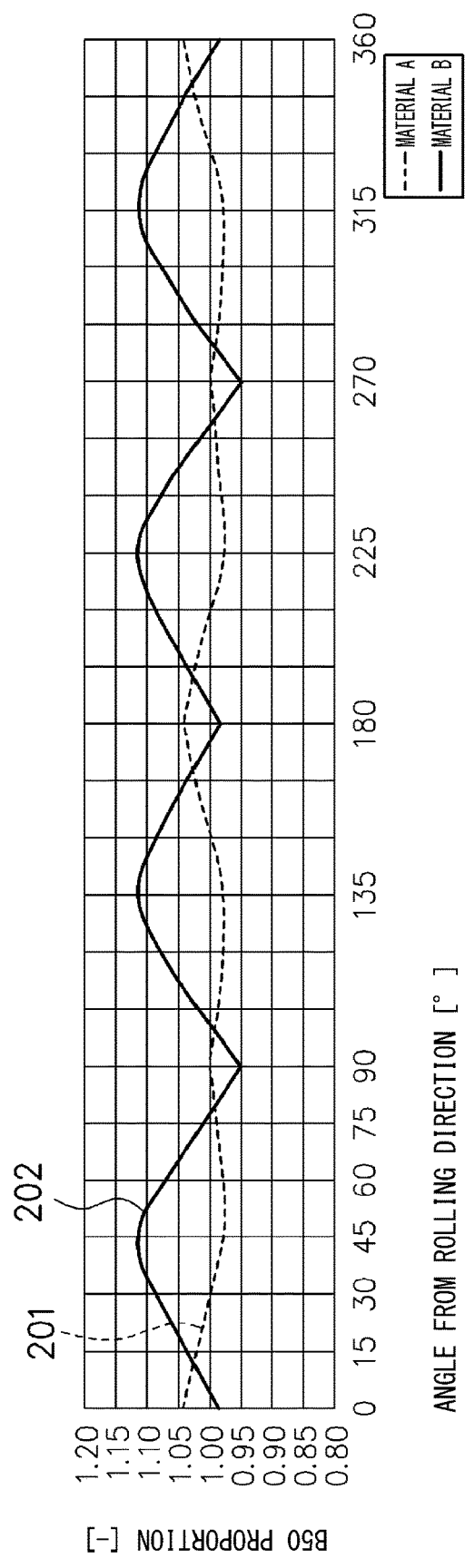
FIG. 2 is a graph showing relationships between an angle from a rolling direction and magnetic characteristics.

FIG. 2 is a graph showing the relationship between the angle from the rolling direction and the magnetic characteristics of each of the material A and the material B. One example of the magnetic characteristic is the magnitude of the magnetic flux density, which is the magnitude of the magnetic flux density (B50) when the non-oriented electrical steel sheet is excited with a magnetic field strength of 5000 [A/m].

Graph 201 shows the normalized magnetic flux density B50 of the material A, and graph 502 shows the normalized magnetic flux density B50 of the material B. The normalized magnetic flux densities B50 in Graph 201 and Graph 202 are each shown as a proportion obtained by normalizing the average of B50's at individual angles from the rolling direction in the material A to 1.000. In addition, in FIG. 2, for ease of notation, the angles from the rolling direction are expressed in the same manner as the angles shown in parentheses in FIG. 1.

In the material A, the magnetic flux density is largest at an angle of 0° from the rolling direction, and the magnetic flux density increases at 90° intervals from 0°. In addition, the magnetic flux density is small at an angle of near 45° from the rolling direction, and the magnetic flux density decreases at 90° intervals from 45°. That is, in the material A, the magnetic characteristics are excellent in directions at angles of 0°, 90°, 180°, and 270° from the rolling direction, and the magnetic characteristics are poor in directions at angles of near 45°, 135°, 225°, and 315° from the rolling direction. Hereinafter, representative values of the directions in which the magnetic characteristics of the material A are poor will be expressed as the angles of 45°, 135°, 225°, and 315° from the rolling direction. In addition, in the material A, the magnetic flux density in a range of angles 0° to 90° and the magnetic flux density in a range of angles 90° to 180° are substantially symmetrical with respect to the angle of 90° as a boundary. Furthermore, in the material A, the magnetic flux density in a range of angles 0° to 180° and the magnetic flux density in a range of angles 180° to 360° are substantially symmetrical with respect to the angle of 180° as a boundary.

On the other hand, in the material B, the magnetic flux density is largest at an angle of 45° from the rolling direction, and the magnetic flux density increases at 90° intervals from 45°. In addition, the magnetic flux density is small at an angle of near 0° from the rolling direction, and the magnetic flux density decreases at 90° intervals from 0°. That is, in the material B, the magnetic characteristics are excellent in directions at angles of 45°, 135°, 225°, and 315° from the rolling direction, and the magnetic characteristics are poor in directions at angles of near 0°, 90°, 180°, and 270° from the rolling direction. Hereinafter, representative values of the directions in which the magnetic characteristics of the material B are poor will be expressed as the angles of 0°, 90°, 180°, and 270° from the rolling direction. In addition, in the material B, the magnetic flux density in a range of angles 0° to 90° and the magnetic flux density in a range of angles 90° to 180° are substantially symmetrical with respect to the angle of 90° as a boundary. Furthermore, in the material B, the magnetic flux density in a range of angles 0° to 180° and the magnetic flux density in a range of angles 180° to 360° are substantially symmetrical with respect to the angle of 180° as a boundary.

In the case of configuring the stator core using the material A or material B in which the magnitudes of the magnetic flux density differ depending on the angles from the rolling direction as shown in FIG. 2, since the angles of the radial directions of the individual teeth of the stator core from the rolling direction differ, when the stator core is excited with a predetermined magnetic field strength, the magnetic flux densities in the individual teeth differ. Therefore, the magnetic flux density in the stator core varies, which increases the iron loss. In the case of configuring a rotary electric machine using such a stator core, the efficiency of the rotary electric machine decreases.

The present inventors obtained an idea that it is preferable to adjust the width of each tooth to reduce the variation in the magnetic flux density in the stator core. Specifically, the inventors considered that it is preferable to set the widths of teeth along the direction in which the magnetic characteristics are excellent to be narrower than the widths of teeth along the direction in which the magnetic characteristics are poor or to set the widths of teeth along the direction in which the magnetic characteristics are excellent to be wider than the widths of teeth along the direction in which the magnetic characteristics are poor. Furthermore, the inventors considered that, in order to further reduce the variation in the magnetic flux density, it is preferable to determine the width of each tooth such that "width of tooth"×"magnetic flux density in tooth" becomes substantially constant in each tooth.

When the stator core is configured based on the above-described idea, the stator core is configured such that, among the teeth 121a to 121p shown in FIG. 1, the widths of the teeth along the direction in which the magnetic characteristics are excellent become narrower than the widths of the teeth along the direction in which the magnetic characteristics are poor.

Specifically, first, in the case of configuring the stator core shown in FIG. 1 using the material A, in the material A, a direction in which the magnetic characteristics are excellent is a direction at an angle of 0° from the rolling direction. Here, the fact that, in the material A, the direction in which the magnetic characteristics are excellent is the direction at an angle of 0° from the rolling direction means that the magnetic characteristics are excellent in directions at angles of 90°, 180°, and 270° as well as 0° from the rolling direction. In addition, in the material A, a direction in which the magnetic characteristics are poor is a direction at an angle of 45° from the rolling direction. Here, the fact that, in the material A, the direction in which the magnetic characteristics are poor is the direction at an angle of 45° from the rolling direction means that the magnetic characteristics are poor in directions at angles of 135°, 225°, and 315° as well as 45° from the rolling direction. That is, in the material A, the magnetic characteristics are excellent in directions at angles of 0°, 90°, 180°, and 270° from the rolling direction, and the magnetic characteristics are poor in directions at angles of 45°, 135°, 225°, and 315° from the rolling direction. Therefore, the width of each tooth of the teeth 121a, 121e, 121i, and 121m is set to be narrower than the width of each tooth of the teeth 121c, 121g, 121k, and 121o, whereby the variation in the magnetic flux density in the stator core can be reduced.

On the other hand, in the case of configuring the stator core shown in FIG. 1 using the material B, in the material B, a direction in which the magnetic characteristics are excellent is a direction at an angle of 45° from the rolling direction. Here, the fact that, in the material B, the direction in which the magnetic characteristics are excellent is the direction at an angle of 45° from the rolling direction means that the magnetic characteristics are excellent in directions at angles of 135°, 225°, and 315° as well as 45° from the rolling direction. In addition, in the material B, a direction in which the magnetic characteristics are poor is directions at angles of 0° and 90° from the rolling direction. Here, the fact that, in the material B, the direction in which the magnetic characteristics are poor is the directions at angles of 0° and 90° from the rolling direction means that the magnetic characteristics are poor in directions at angles of 180° and 270° as well as 0° and 90° from the rolling direction. That is, in the material B, the magnetic characteristics are excellent in directions at angles of 45°, 135°, 225°, and 315° from the rolling direction, and the magnetic characteristics are poor in directions at angles of 0°, 90°, 180°, and 270° from the rolling direction. Therefore, the width of each tooth of the teeth 121c, 121g, 121k, and 1210 is set to be narrower than the width of each tooth of the teeth 121a, 121e, 121i, and 121m, whereby the variation in the magnetic flux density in the stator core can be reduced.

Figure 3:
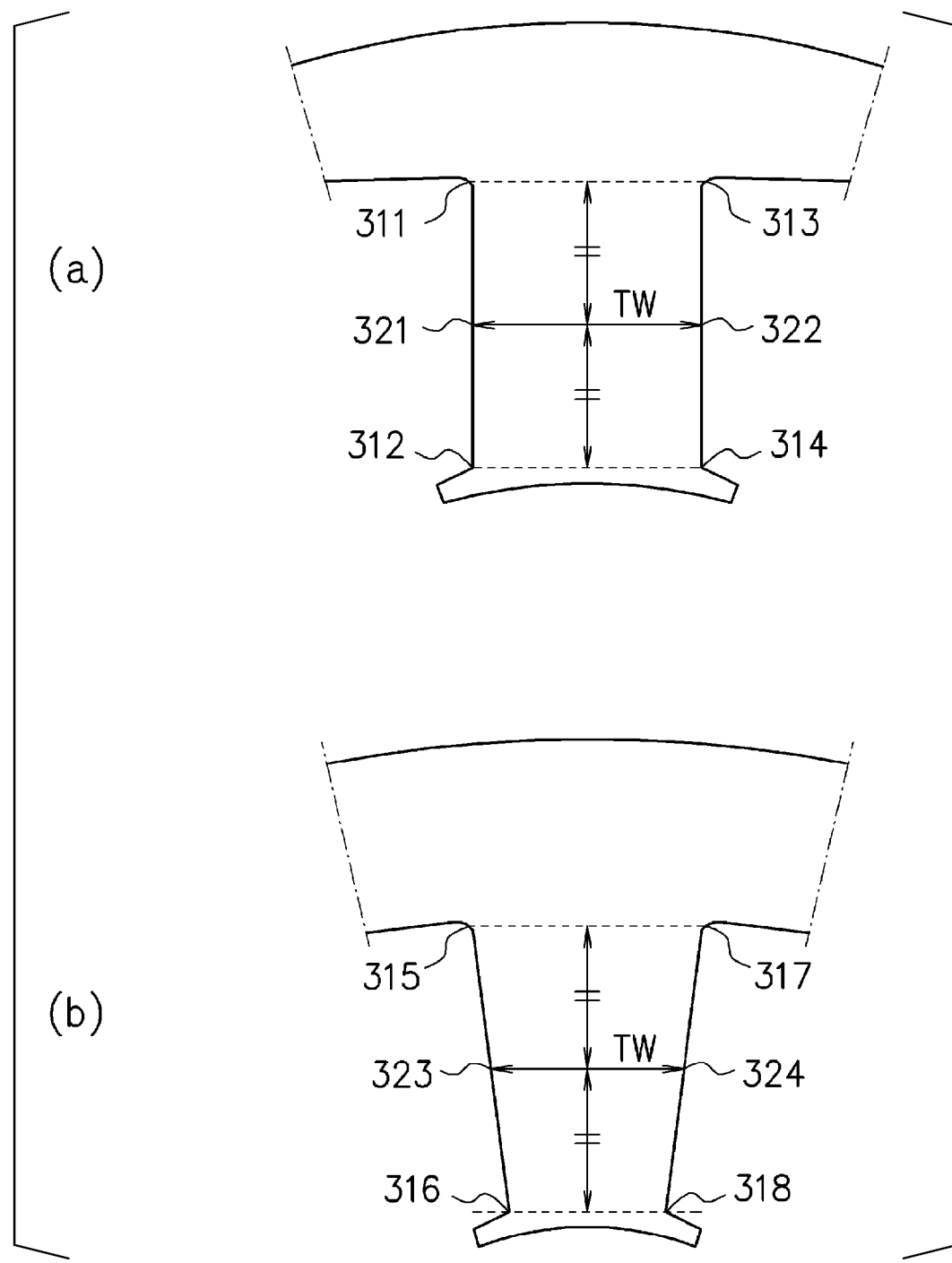
FIG. 3 is views for describing the width of a tooth.

Here, the widths of the teeth will be described with reference to FIG. 3. FIG. 3 is a view for describing the width of a tooth. FIG. 3(*a*) is an example of a tooth parallel to the radial direction. In this example, the tooth itself is parallel to the radial direction. FIG. 3(*b*) is an example of a tooth for which slots are parallel to the radial direction. In this example, the slot positioned between teeth adjacent to each other in the circumferential direction is parallel to the radial direction.

The width of a tooth in the present embodiment is defined as the length of the stator core in the circumferential direction between the central positions of tooth straight line regions. The tooth straight line region is a region having the longest straight line among the straight lines configuring the end portions of the teeth in the circumferential direction of the stator core in a cross section of the stator core cut in a direction perpendicular to the axis of the stator core and is obtained from each of two end portions of a tooth in the circumferential direction of the stator core.

In the example shown in FIG. 3(a), a straight line that connects positions 311 and 312 and a straight line that connects positions 313 and 314 are the tooth straight line regions. In addition, in the example shown in FIG. 3(a), the central positions of the tooth straight line regions are positions 321 and 322. Therefore, the width of the teeth shown in FIG. 3(a) is a distance TW between the position 321 and the position 322.

In the example shown in FIG. 3(b), a straight line that connects positions 315 and 316 and a straight line that connects positions 317 and 318 are the tooth straight line regions. In addition, in the example shown in FIG. 3(b), the central positions of the tooth straight line regions are positions 323 and 324. Therefore, the width of the teeth shown in FIG. 3(b) is a distance TW between the position 323 and the position 324.

Since FIG. 3(a) is an example of a tooth parallel to the radial direction, the width of the tooth is constant regardless of places in the radial direction in the tooth straight line region.

On the other hand, since FIG. 3(b) is an example of a tooth the slots are an example of the teeth for which slots are parallel to the radial direction, the actual width of the tooth differs depending on places in the radial direction in the tooth straight line region. Therefore, the width of the tooth is defined as a distance TW between the above-described position 323 and position 324 as a representative value.

<Example of Determining Width of Tooth (Tooth for which Slots are Parallel to Radial Direction (Material A))>

Next, an example of determining the width of a tooth such that the above-described "width of tooth"ב"magnetic flux density in tooth" becomes substantially constant in each tooth in a case where the electrical steel sheet is the material A and a stator core for an embedded permanent magnet-type synchronous motor is designed will be described. In the example of the embedded permanent magnet-type synchronous motor to be described herein, slots between teeth of the stator core are parallel to the radial directions as shown in FIG. 3(b).

Figure 4:
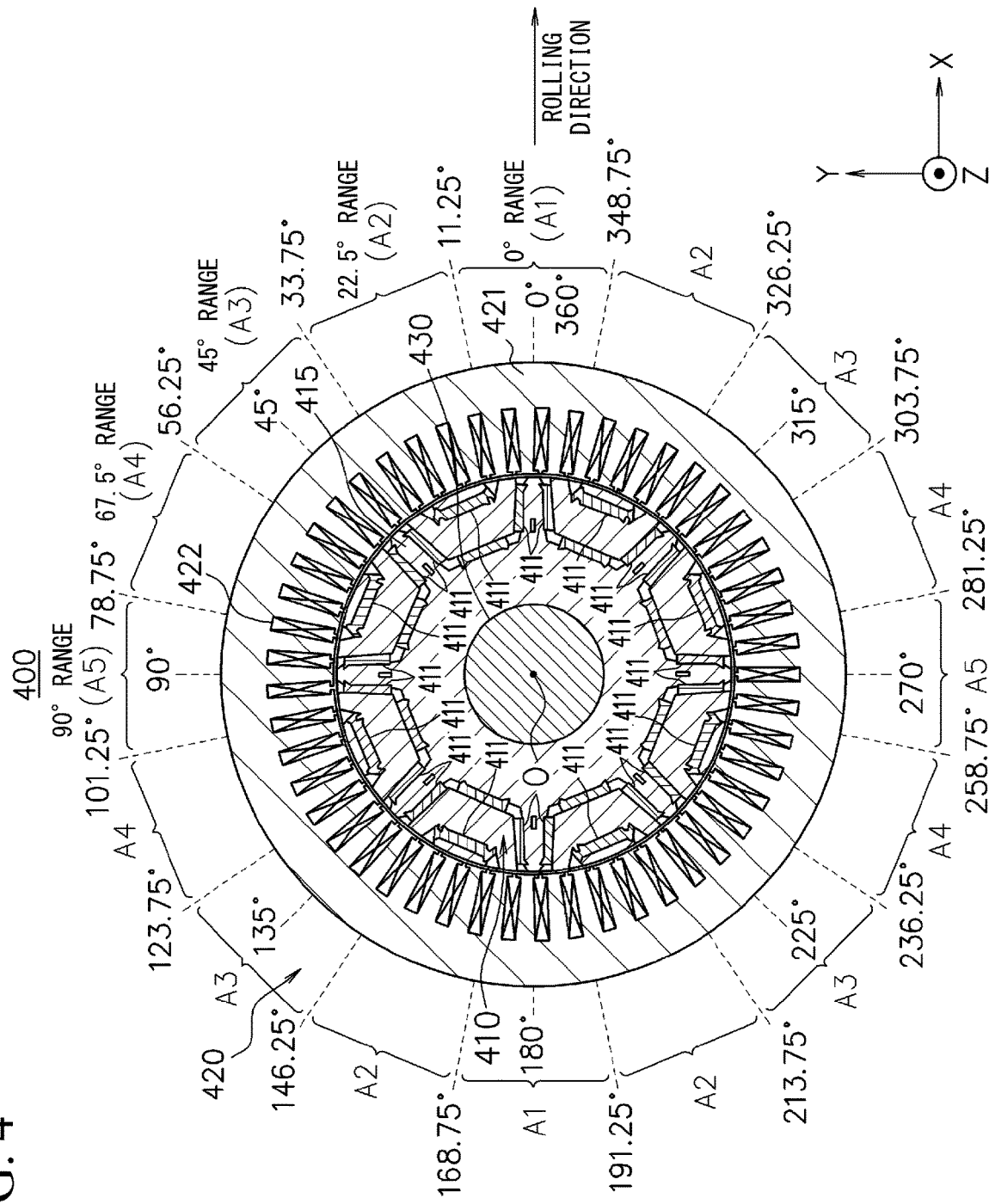
FIG. 4 is a view showing an example of the configuration of a motor.

FIG. 4 is a view showing an example of the configuration of a motor 400 before the widths of teeth are determined, that is, the widths of the individual teeth are constant along the whole circumference. FIG. 4 shows a cross section of the motor 400 cut perpendicular to the axis O.

In FIG. 4, the motor 400 is an embedded permanent magnet-type synchronous motor (IPMSM: Interior Permanent Magnet Synchronous Motor) and has a rotor 410 and a stator 420.

The rotor 410 is attached to a rotating shaft 430 so as to be concentric with the rotating shaft 430 (axis O). The rotor 410 has a plurality of permanent magnets 411. The permanent magnets 411 are embedded in a rotor core 415. As shown in FIG. 4, the number of poles in the motor 400 is eight. The outer diameter of the rotor 410 is 133 [mm].

The stator 420 has a stator core 421 and a coil 422. The outer diameter of the stator 420 is 207 [mm], and the inner diameter of the stator 420 is 135 [mm]. In addition, the number of slots in the stator core 421 is 48. In addition, the coil 422 is a distributed coiling.

Figures 5, 6:
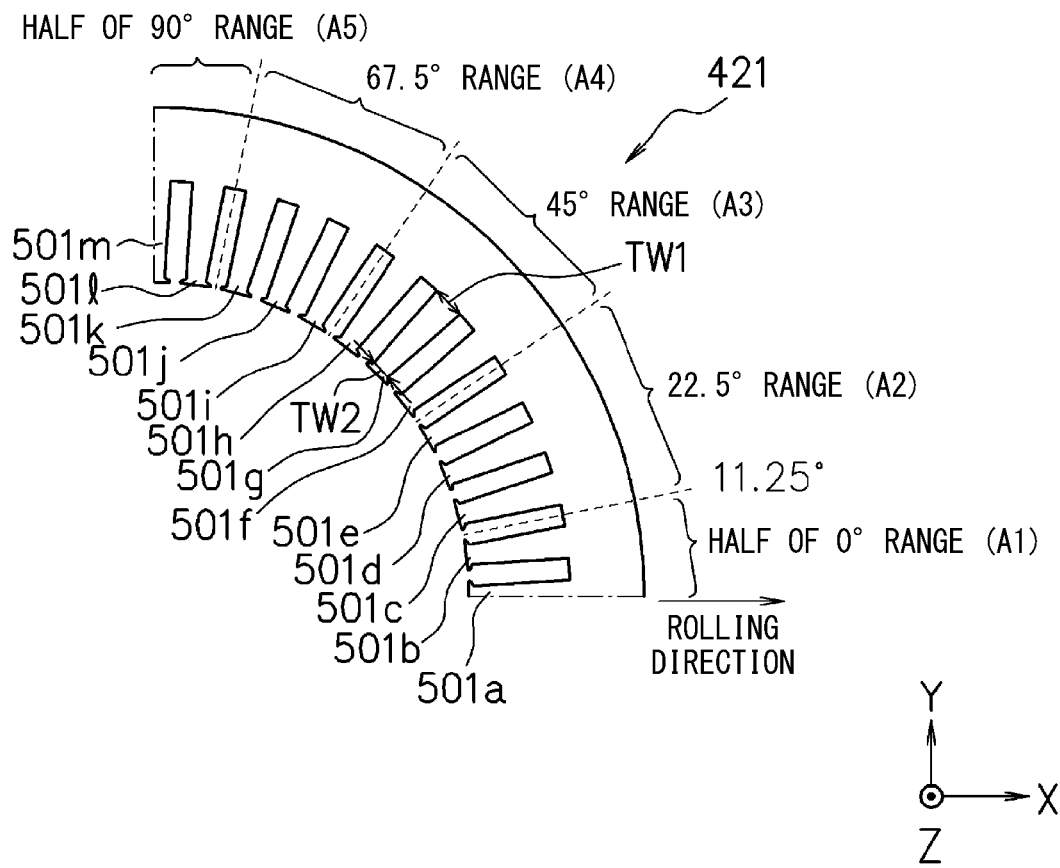
FIG. 5 is a view showing angles of 0° to 90° from the rolling direction in a stator core.
FIG. 6 is a table showing a relationship between a torque proportion and an average magnetic flux density in the teeth.

FIG. 5 is an enlarged view of a portion at angles of 0° to 90° from the rolling direction in the stator core 421 of FIG. 4 extracted and enlarged. Here, among teeth 501a to 501m of the stator core 421, the tooth 501a is positioned at an angle of 0° from the rolling direction, and only ½ of the width of the tooth is shown. In addition, among the teeth 501a to 501m, the tooth 501m is positioned at an angle of 90° from the rolling direction, and only ½ of the width of the tooth is shown.

In addition, slots between the individual teeth each have a shape that is parallel to the radial direction as shown in FIG. 3(b). As shown in FIG. 5, a width TW1 of the root of the tooth is 6.56 mm, and a width TW2 of the tip end is 5.16 mm. Therefore, the width of the tooth (TW shown in FIG. 3(b)) is 5.86 mm from a calculation of (6.56 mm+5.16 mm)/2.

Here, the analysis results of the relationship between an operating condition (torque proportion) and the average magnetic flux density in the teeth in a case where the rotation speed of the motor 400 is set to 3,000 [rpm] and the widths of the teeth are constant along the whole circumference of the stator core 421 are shown in FIG. 6.

FIG. 6 is a table showing the relationship between the torque proportion [%], which is an operating condition for the motor 400, and the average magnetic flux density B [$T^{peak}$] in the teeth. Here, the torque proportion represents a torque proportion under each operating condition with an assumption that the torque proportion at the maximum torque is regarded as 100 [%]. For example, a torque proportion of 20 [%] means that the motor is operated with a torque value [Nm] of the maximum torque [Nm]×0.2. In addition, the average magnetic flux density in the teeth is a value obtained by averaging the maximum values of the magnetic flux densities in the individual places of 48 teeth. That is, "peak" in [$T^{peak}$] indicates the magnetic flux density of a peak when the magnetic flux density changes as time elapses. In FIG. 6, the average magnetic flux density in the teeth increases as the torque proportion increases. The relationship between the torque proportion and the average magnetic flux density in the teeth shown in FIG. 6 can be derived by performing electromagnetic field analysis (numerical value analysis) based on Maxwell's equations or by actually measuring induced voltages using search coils in the core of a manufactured motor and integrating the induced voltages. In the case of obtaining the relationship from the electromagnetic field analysis (numerical value analysis), the average magnetic flux density can be obtained by calculating the maximum magnetic flux density in each of all elements (all meshes) that are included in the tooth parts (all of the 48 teeth in the present example) in the finite element method and averaging the maximum magnetic flux densities in consideration of the area of each element. In the case of actually measuring induced voltages using search coils, a time waveform of the magnetic flux density is obtained by integrating induced voltages that are measured in each search coil, then, the maximum magnetic flux densities are calculated and averaged in consideration of the cross-sectional area of the core that is surrounded by each search coil, whereby the average magnetic flux density can be obtained.

From the average magnetic flux densities in the teeth shown in FIG. 6, the average magnetic field strengths H [A/m] of the teeth are calculated. The average magnetic field strength of the teeth can be calculated based on the relative magnetic permeability of the material A. Here, the average magnetic field strength of the teeth is calculated for each torque proportion (that is, for each average magnetic flux density in the teeth shown in FIG. 6). Next, the magnetic flux density B [T] in the teeth at each angle from the rolling direction when the motor is excited with the average magnetic field strength of the teeth is calculated based on the material characteristics of the material A. Therefore, the magnetic flux density in the teeth at each angle from the rolling direction is calculated for each torque proportion (that is, for each average magnetic flux density in the teeth shown in FIG. 6).

FIG. 7 is a table showing the relationship between the torque proportion [%] and the magnetic flux density B [T] in the teeth at each angle from the rolling direction. Here, angles of 0°, 22.5°, 45°, 67.5°, and 90° from the rolling direction are regarded as representative values, and the magnetic flux density is regarded as being the same in three teeth for which the angle of the representative value is centered.

The teeth at an angle of 0° from the rolling direction are the teeth 501a and 501b that are included in a 0° range (A1) shown in FIG. 5. In addition, the teeth at an angle of 22.5° from the rolling direction are the teeth 501c to 501e that are included in a 22.5° range shown in FIG. 5. In addition, the teeth at an angle of 45° from the rolling direction are the teeth 501f to 501h that are included in a 45° range (A3) shown in FIG. 5. In addition, the teeth at an angle of 67.5° from the rolling direction are the teeth 501i to 501k that are included in a 67.5° range (A4) shown in FIG. 5. In addition, the teeth at an angle of 90° from the rolling direction are the teeth 501l and 501m that are included in a 90° range (A5) shown in FIG. 5.

As shown in FIG. 7, at the torque proportions of 20 [%], 40 [%], 60 [%], and 80 [%], the magnetic flux density in the teeth at each angle from the rolling direction varies. In addition, at the torque proportions of 40 [%], 60 [%], and 80 [%], the magnetic flux densities in the teeth at angles of 0° and 90° from the rolling direction are large, and the magnetic flux density in the teeth at an angle of 45° from the rolling direction is small Such a tendency coincides with the tendency that the B50 proportion is large at angles of 0° and 90° from the rolling direction and the B50 proportion is small at an angle of 45° from the rolling direction as shown by Graph 201 of the material A shown in FIG. 2. On the other hand, as shown in FIG. 7, at the torque proportion of 100 [%], since the motor is magnetically saturated, the magnetic flux density in the teeth is constant regardless of the angles from the rolling direction.

The relationship between the torque proportion and the magnetic flux density in the teeth at each angle from the rolling direction shown in FIG. 7 can be derived from the B-H characteristics of the material A at the angle from the rolling direction.

Next, in order to reduce the variation in the magnetic flux density in the teeth, the optimum widths of the teeth are determined for each angle from the rolling direction. Specifically, based on the magnetic flux density in the teeth at each angle from the rolling direction shown in FIG. 7, the widths of the teeth are determined such that "width of tooth"דmagnetic flux density in tooth" becomes substantially constant in each tooth. Here, the widths of the teeth are determined for each torque proportion.

For example, when a case where the torque proportion is 60 [%] in FIG. 7 is taken as an example, the magnetic flux density in the teeth is 1.65 [T] at an angle of 0° from the rolling direction, the magnetic flux density in the teeth is 1.61 [T] at an angle of 22.5°, the magnetic flux density in the teeth is 1.55 [T] at an angle of 45°, the magnetic flux density in the teeth is 1.56 [T] at an angle of 67.5°, and the magnetic flux density in the teeth is 1.59 [T] at an angle of 90°. Therefore, the widths of the teeth are determined such that "width of tooth"דmagnetic flux density in tooth" become substantially constant at any angles of 0°, 22.5°, 45°, 67.5°, and 90°. The widths of the teeth determined as described above are referred to as the optimum width.

FIG. 8 is a table showing the relationship between the torque proportion [%] and the optimum width [mm] of the tooth determined for each angle from the rolling direction.

For example, when a case where the torque proportion is 60 [%] in FIG. 8 is taken as an example, the optimum width of the tooth is 5.64 [mm] at an angle of 0° from the rolling direction, the optimum width of the tooth is 5.76 [mm] at an angle of 22.5°, the optimum width of the tooth is 5.99 [mm] at an angle of 45°, the optimum width of the tooth is 5.96 [mm] at an angle of 67.5°, and the optimum width of the tooth is 5.85 [mm] at an angle of 90°. Here, the products obtained by multiplying "magnetic flux density in tooth" in a case where the torque proportion is 60 [%] in FIG. 7 by "optimum width of tooth" in a case where the torque proportion is 60 [%] in FIG. 8 at each angle from the rolling direction are all 9.3 and substantially constant.

The optimum widths of the teeth determined as described above are applied to the widths of the teeth according to the angles from the rolling direction, thereby designing a stator core.

For example, when a case where the torque proportion is 60 [%] in FIG. 8 is taken as an example, a stator core is designed by setting the widths of the teeth 501a and 501b that are included in the 0° range (A1) shown in FIG. 5 to 5.64 [mm], the widths of the teeth 501c to 501e that are included in the 22.5° range (A2) to 5.76 [mm], the widths of the teeth 501f to 501h that are included in the 45° range (A3) to 5.99 [mm], the widths of the teeth 501i to 501k that are included in the 67.5° range (A4) to 5.96 [mm], and the widths of the teeth 501l and 501m that are included in the 90° range (A5) to 5.85 [mm].

As described with Graph 201 showing the relationship between the angle from the rolling direction and the magnetic characteristics of the material A in FIG. 2, in the material A, the magnetic flux density in the range of angles 0° to 90° and the magnetic flux density in the range of angles 90° to 180° are substantially symmetrical with respect to the angle of 90° as a boundary. Furthermore, in the material A, the magnetic flux density in a range of angles 0° to 180° and the magnetic flux density in a range of angles 180° to 360° are substantially symmetrical with respect to the angle of 180° as a boundary.

Therefore, since the magnetic flux density B [T] in the teeth at each angle from the rolling direction shown in FIG. 7 is substantially the same not only in a range of the angle 0° from the rolling direction (angles of 348.75° to 11.25°: A1) but also at angles of 168.75° to 191.25° shown in FIG. 4, teeth that are included at the angles of 168.75° to 191.25° are also designed to have substantially the same widths as the widths of the teeth that are included in the 0° range (A1).

Similarly, teeth that are included at angles of 146.25° to 168.75°, 191.25° to 213.75°, and 326.25° to 348.75° shown in FIG. 4 are also designed to have substantially the same widths as the widths of the teeth that are included in the 22.5° range (11.25° to 33.75°: A2).

Similarly, teeth that are included at angles of 123.75° to 146.25°, 213.75° to 236.25°, and 303.75° to 326.25° shown in FIG. 4 are also designed to have substantially the same widths as the widths of the teeth that are included in the 45° range (angles of 33.75° to 56.25°: A3).

Similarly, teeth that are included at angles of 101.25° to 123.75°, 236.25° to 258.75°, and 281.25° to 303.75° shown in FIG. 4 are also designed to have substantially the same widths as the widths of the teeth that are included in the 67.5° range (angles of 56.25° to 78.75°: A4).

Similarly, teeth that are included at angles of 258.75° to 281.25° shown in FIG. 4 are also designed to have substantially the same widths as the widths of the teeth that are included in the 90° range (78.75° to 101.25°: A5).

In the stator core designed as described above, the widths of the teeth along the direction in which the magnetic characteristics are excellent become narrower than the widths of the teeth along the direction in which the magnetic characteristics are poor. In the material A, the teeth along the direction in which the magnetic characteristics are excellent are not limited to the teeth at the angle of 0° from the rolling direction and the teeth at the angle of 90° from the rolling direction and also include teeth positioned in the vicinity of these teeth. Specifically, in the material A, the teeth along the direction in which the magnetic characteristics are excellent are the teeth that are included at the angles of 348.75° to 11.25°, the teeth that are included at the angles of 168.75° to 191.25°, the teeth that are included at the angles of 78.75° to 101.25°, and the teeth that are included at the angles of 258.75° to 281.25°.

In addition, in the material A, the teeth along the direction in which the magnetic characteristics are poor are not limited to the teeth at the angle of 45° from the rolling direction and the teeth at the angles of 135°, 225°, and 315° from the rolling direction and also include teeth positioned in the vicinity of these teeth. Specifically, in the material A, the teeth along the direction in which the magnetic characteristics are poor are the teeth that are included at the angle of 33.75° to 56.25°, the teeth that are included at the angles of 123.75° to 146.25°, the teeth that are included at the angles of 213.75° to 236.25°, and the teeth that are included at the angles of 303.75° to 326.25°.

FIG. 9 is a table showing the relationship of the iron loss proportion [−] between a stator core in which the widths of the teeth are designed to be the optimum widths of each torque proportion [%] and a stator core in which the widths of the teeth are set to be constant along the whole circumference. The iron loss proportion is a value obtained by dividing the iron loss of a motor of an invention example by the iron loss of a motor of a comparative example when a motor including the stator core in which the widths of the teeth are designed to be the optimum widths is defined as the invention example and a motor including the stator core in which the widths of the teeth are set to be constant along the whole circumference is defined as the comparative example. Here, the iron loss proportion is calculated for each torque proportion. The iron loss can be derived by performing electromagnetic field analysis (numerical value analysis) under a condition where the motor of the invention example and the motor of the comparative example are each operated at a rotation speed of 3,000 [rpm] such that the torque proportion "%" becomes each value described above. In addition, the iron loss can also be derived by actually measuring a manufactured motor.

From the results of the iron loss proportion shown in FIG. 9, it is possible to confirm that, at the torque proportions of 20 [%], 40 [%], 60 [%], and 80 [%], iron losses of 0.1 [%] to 1.3 [%] can be suppressed. On the other hand, at the torque proportion of 100 [%], as described above, since the motor was magnetically saturated, and the magnetic flux density in the teeth was constant regardless of the angles from the rolling direction, it was not possible to confirm an effect by which iron losses could be suppressed.

It was possible to confirm that, when the widths of the teeth are determined such that "width of tooth"×"magnetic flux density in tooth" becomes substantially constant in each tooth depending on the operating condition such as the torque proportion, it is possible to reduce the variation in the magnetic flux density and to suppress iron losses in regions where the motor is not magnetically saturated.

In a stator core actually manufactured after the widths of the teeth are once determined, it is not possible to change the widths of the teeth each time the operating condition such as the torque proportion changes. Therefore, in designing a stator core, among a plurality of operating conditions (a plurality of torque proportions), any one operating condition (torque proportion) is selected with, for example, a device for designing the stator core or the like. The widths of the teeth are determined such that "width of tooth"×"magnetic flux density in tooth" becomes constant in each tooth under the selected operating condition, and the stator core is designed. This makes it possible to reduce the variation in the magnetic flux density of the stator core under the selected operating condition.

Incidentally, when a motor including the designed stator core is operated, in a case where the time during which the motor is operated under the selected operating condition is zero or short, it is not possible to actually reduce the variation in the magnetic flux density to suppress iron losses. Therefore, in designing a stator core, it is necessary to determine the widths of teeth in advance such that iron losses can be suppressed most in consideration of the operation of a rotary electric machine.

Hereinafter, two methods for designing a stator core will be described. The two design methods may be performed with a device for designing a stator core to be described below or may be performed by a designer of the stator core.

[First Design Method for Stator Core]

A first design method is a method in which, in a case where a rotary electric machine including a stator core to be designed is supposed to be operated, among a plurality of operating conditions, an operating condition having a highest proportion of an operating time in the entire operating time is specified, and the optimum widths of the teeth under the specified operating condition are determined.

FIG. 10 shows an example of operation data in the case of supposing the operation of a rotary electric machine including a stator core to be designed. Specifically, FIG. 10 shows an example of the proportions of the operating time according to the torque proportions in a motor 600 including a stator core to be designed. Here, the operating time refers to a time during which the motor 600 is rotating. The operation data shown in FIG. 10 is acquired in advance before the stator core is designed.

In FIG. 10, among the plurality of operating conditions, the proportion of the operating time for a torque proportion of 30 [%] to 50 [%] is 45 [%] and thus corresponds to the operating condition having the highest proportion of the operating time. Therefore, in this case, the average magnetic field strength H [A/m] of the teeth is calculated from an average magnetic flux density in the teeth of 1.44 [$T^{peak}$] that corresponds to the torque proportion of 40 [%] among the torque proportions shown in FIG. 6. In the description of <example of determining width of tooth (tooth for which slots are parallel to radial direction (material A))> described above, the magnetic flux density B [T] of the teeth at each angle from the rolling direction was calculated for each torque proportion as shown in FIG. 7, and the optimum widths of the teeth at each angle from the rolling direction were determined as shown in FIG. 8. Incidentally, here, the magnetic flux density B [T] of the teeth at each angle from the rolling direction shown in FIG. 7 is calculated only for the torque proportion of 40 [%] having the highest proportion of the operating time. The optimum widths of the teeth are determined for each angle from the rolling direction shown in FIG. 8 only for the torque proportion of 40 [%] having the highest proportion of the operating time.

Therefore, for each tooth, one optimum width is determined. When a stator core is designed by applying the optimum widths determined as described above to the widths of the teeth, it is possible to reduce the variation in the magnetic flux density and to suppress iron losses under the operating conditions with the highest proportion of the operating time.

[Second Design Method for Stator Core]

A second design method is a method in which, in a case where a rotary electric machine including a stator core to be designed is supposed to be operated, a proportion of the operating time is specified for each of a plurality of operating conditions, and the widths of the teeth are weighted based on the specified proportion of the operating time for each of the plurality of operating conditions.

The second design method will also be described with reference to the example of the operation data shown in FIG. 10. In addition, in the second design method as well, the operation data shown in FIG. 10 is acquired in advance before the stator core is designed.

In the second design method, similar to the above-described <example of determining width of tooth (tooth for which slots are parallel to radial direction (material A))>, the relationship between the torque proportion and the average magnetic flux density in the teeth shown in FIG. 6 is derived, and the relationship between the torque proportion and the magnetic flux density in the teeth at each angle from the rolling direction shown in FIG. 7 is derived. From those relationships, the optimum width of the tooth at each angle from the rolling direction shown in FIG. 8 is calculated for each torque proportion.

Next, the optimum width of the tooth at each angle from the rolling direction is weighted based on the proportion of the operating time according to the torque proportion shown in FIG. 10. Specifically, the optimum widths of the teeth for each torque proportion are each multiplied by the proportion of the operating time according to the torque proportion shown in FIG. 10 at each angle from the rolling direction shown in FIG. 8. Here, since there are five types of torque proportions, five values are calculated by multiplying the optimum widths of the teeth for individual torque proportions by the proportion of the operating time according to the torque proportion. Next, the five calculated values are added and divided by 100, whereby it is possible to calculate the widths of the teeth weighted based on the proportion of the operating time at a predetermined angle from the rolling direction. Similarly, the widths of the teeth weighted based on the proportion of the operating time are also calculated in the same manner at other angles from the rolling direction.

For example, when a case where the angle is 0° from the rolling direction is taken as an example, in FIG. 8, at the torque proportions of 20 [%], 40 [%], 60 [%], 80 [%], and 100 [%], the optimum widths of the teeth are 5.40 [mm], 5.57 [mm], 5.64 [mm], 5.79 [mm], and 5.86 [mm]. The optimum widths of the teeth are each multiplied by the proportion of the operating time according to the corresponding torque proportion of 20 [%], 45 [%], 20 [%], 10 [%], or 5 [%] shown in FIG. 10, thereby calculating five values of 108 [mm %], 250.65 [mm %], 112.8 [mm %], 57.9 [mm %], and 29.3 [mm %]. The five values are added and divided by 100, whereby the width of the tooth weighted based on the proportion of the operating time of 5.58 [mm] is calculated at an angle of 0° from the rolling direction. The widths of the teeth weighted based on the proportions of the operating time are also calculated in the same manner at the angles of 22.5°, 45°, 67.5°, and 90° from the rolling direction.

FIG. 11 is a table showing the widths of the teeth weighted based on the proportion of the operating time shown in FIG. 10 at each angle from the rolling direction. In FIG. 10, the proportion of the operating time at the torque proportion of 30 [%] to 50 [%] is 45 [%], which is the highest proportion of the operating time. Therefore, as the widths of the teeth weighted as shown in FIG. 11, values close to the optimum widths of the teeth at the torque proportion of 40 [%] shown in FIG. 8 are calculated.

When a stator core is designed by applying the widths of the teeth weighted based on the proportion of the operating time, it is possible to reduce the variation in the magnetic flux density for the entire operating time.

Here, a motor including a stator core designed to have the widths of the teeth weighted as shown in FIG. 11 was regarded as an invention example, and a motor including a stator core in which the widths of the teeth were set to be constant along the whole circumference was regarded as a comparative example. The iron loss proportion at the time of operating each of the motors at the rotation speed of 3,000 [rpm] and the proportion of the operating time shown in FIG. 10 was 0.993, and it was possible to confirm that the iron loss could be suppressed to 0.7 [%]. As described above, when a rotary electric machine is configured by designing a stator core by applying the widths of the teeth weighted based on the proportion of the operating time, it is possible to suppress iron losses.

[Method for Acquiring Operation Data]

In the above-described [first design method for stator core], before a stator core is designed, it is necessary to specify, among a plurality of operating conditions, an operating condition having the highest proportion of the operating time in a rotary electric machine including the stator core to be designed. In addition, in the above-described [second design method for stator core], before a stator core is designed, it is necessary to specify the proportion of an operating time according to operating conditions in a rotary electric machine including the stator core to be designed.

That is, in any case of the first design method and the second design method, in order to design a stator core, it is necessary to acquire in advance operation data with a supposition of the operation of a rotary electric machine including the stator core to be designed.

Here, the operation data is roughly classified into two types, that is, planned data and actual data.

The planned data is data for which the operation of a rotary electric machine is determined in advance and the operating time according to operating conditions is planned. For example, a rotary electric machine that is used in a predetermined production facility often continues a certain operation or repeats a certain operation. In such a rotary electric machine, it is possible to acquire planned data in advance. When the planned data is acquired, it is possible to specify the information on an operating condition having the highest proportion of the operating time or specify the proportion of the operating time according to operating conditions.

On the other hand, the actual data is data for which the same type of rotary electric machines have already been operated and operating times according to operating conditions have been accumulated as actual achievements. For example, for rotary electric machines that are used for hybrid electric vehicles (HEV) or electric vehicles (EV), since the operating times according to operating conditions differ with users (drivers), it is not possible to acquire planned data. In such a case, actual data can be acquired in advance by collecting a huge amount of data from vehicles in actual operation and analyzing the collected big data. For example, data may be acquired by analyzing the operating times according to operating conditions of rotary electric machines when vehicles are driven to travel in a JC08 mode, which is the Japanese fuel consumption measurement standard. When the actual data is acquired, it is possible to specify the information on an operating condition having the highest proportion of the operating time or specify the proportion of the operating time according to operating conditions.

As described above, when the operation data is acquired from the planned data or the actual data, it is possible to specify an operating condition having the highest proportion of the operating time among a plurality of operating conditions or specify the proportions of the operating times according to operating conditions before a stator core is designed.

<Example of Determining Width of Tooth (Tooth for which Slots are Parallel to Radial Direction (Material B))>

Next, an example of determining the width of a tooth such that the above-described "width of tooth"×"magnetic flux density in tooth" becomes substantially constant in each tooth in a case where the electrical steel sheet is the material B and a stator core for an embedded permanent magnet-type synchronous motor is designed will be described. The same contents as the above-described <example of determining width of tooth (tooth for which slots are parallel to radial direction (material A))> will not be described again as appropriate.

Here, the analysis results of the relationship between an operating condition (torque proportion) and the average magnetic flux density in the teeth in a case where the rotation speed of the motor 400 shown in FIG. 4 is set to 3,000 [rpm] and the widths of the teeth are constant along the whole circumference of the stator core 421 are the same as in FIG. 6.

From the average magnetic flux densities in the teeth shown in FIG. 6, the average magnetic field strengths H [A/m] of the teeth are calculated. Next, the magnetic flux density B [T] in the teeth at each angle from the rolling direction when the motor is excited with the average magnetic field strength of the teeth is calculated based on the material characteristics of the material B.

FIG. 12 is a table showing the relationship between the torque proportion [%] and the magnetic flux density B [T] in the teeth at each angle from the rolling direction.

As shown in FIG. 12, at the torque proportions of 20 [%], 40 [%], 60 [%], and 80 [%], the magnetic flux density in the teeth at each angle from the rolling direction varies. In addition, at the torque proportions of 20 [%], 40 [%], 60 [%], and 80 [%], the magnetic flux density in the teeth at an angle of 45° from the rolling direction is large, and the magnetic flux densities in the teeth at angles of 0° and 90° from the rolling direction is small. Such a tendency coincides with the tendency that the B50 proportion is large at an angle of 45° from the rolling direction and the B50 proportion is small at angles of 0° and 90° from the rolling direction as shown by Graph 202 of the material B shown in FIG. 2. On the other hand, as shown in FIG. 12, at the torque proportion of 100 [%], since the motor is magnetically saturated, the magnetic flux density in the teeth is constant regardless of the angles from the rolling direction.

Next, based on the magnetic flux density in the teeth at each angle from the rolling direction shown in FIG. 12, the widths of the teeth are determined such that "width of tooth"×"magnetic flux density in tooth" becomes substantially constant in each tooth.

FIG. 13 is a table showing the relationship between the torque proportion [%] and the optimum width [mm] of the tooth determined for each angle from the rolling direction. The determined optimum widths of the teeth are applied to the widths of the teeth according to the angles from the rolling direction, thereby designing a stator core.

In the stator core designed as described above, the widths of the teeth along the direction in which the magnetic characteristics are excellent become narrower than the widths of the teeth along the direction in which the magnetic characteristics are poor. In the material B, the teeth along the direction in which the magnetic characteristics are excellent are not limited to the teeth at the angle of 45° from the rolling direction and the teeth at the angles of 135°, 225°, and 315° from the rolling direction and also include teeth positioned in the vicinity of these teeth. Specifically, in the material B, the teeth along the direction in which the magnetic characteristics are poor are the teeth that are included at the angle of 33.75° to 56.25°, the teeth that are included at the angles of 123.75° to 146.25°, the teeth that are included at the angles of 213.75° to 236.25°, and the teeth that are included at the angles of 303.75° to 326.25°.

In addition, in the material B, the teeth along the direction in which the magnetic characteristics are poor are not limited to the teeth at the angles of 0° and 90° from the rolling direction and also include teeth positioned in the vicinity of these teeth. Specifically, in the material B, the teeth along the direction in which the magnetic characteristics are excellent are the teeth that are included at the angles of 348.75° to 11.25°, the teeth that are included at the angles of 168.75° to 191.25°, the teeth that are included at the angles of 78.75° to 101.25°, and the teeth that are included at the angles of 258.75° to 281.25°.

FIG. 14 is a table showing the relationship of the iron loss proportion [-] between a stator core in which the widths of the teeth are designed to be the optimum widths of each torque proportion [%] and a stator core in which the widths of the teeth are set to be constant along the whole circumference.

From the results of the iron loss proportion shown in FIG. 14, it is possible to confirm that, at the torque proportions of 20 [%], 40 [%], 60 [%], and 80 [%], iron losses of 0.6 [%] to 6.4 [%] can be suppressed. On the other hand, at the torque proportion of 100 [%], since the motor was magnetically saturated, and the magnetic flux density in the teeth was constant regardless of the angles from the rolling direction, it was not possible to confirm an effect by which iron losses could be suppressed.

It was possible to confirm that, when the widths of the teeth are determined such that "width of tooth"×"magnetic flux density in tooth" becomes substantially constant in each tooth depending on the operating condition such as the torque proportion, it is possible to reduce the variation in the magnetic flux density and to suppress iron losses in regions where the motor is not magnetically saturated.

Next, the optimum width of the tooth at each angle from the rolling direction is weighted based on the proportion of the operating time according to the torque proportion shown in FIG. 10 in the same manner as in the above-described [second design method for stator core].

FIG. 15 is a table showing the widths of the teeth weighted based on the proportion of the operating time shown in FIG. 10 at each angle from the rolling direction.

Here, a motor including a stator core designed to have the widths of the teeth weighted as shown in FIG. 15 was regarded as an invention example, and a motor including a stator core in which the widths of the teeth were set to be constant along the whole circumference was regarded as a comparative example. The iron loss proportion at the time of operating each of the motors at the rotation speed of 3,000 [rpm] and the proportion of the operating time shown in FIG. 10 was 0.958, and it was possible to confirm that the iron loss could be suppressed to 4.2 [%].

<Example of Determining Width of Tooth (Tooth Parallel to Radial Direction (Material A))>

Next, an example of determining the width of a tooth such that the above-described "width of tooth"דmagnetic flux density in tooth" becomes substantially constant in each tooth in a case where the electrical steel sheet is the material A and a stator core for an induction motor is designed will be described. The same contents as the above-described <example of determining width of tooth (tooth for which slots are parallel to radial direction (material A))> will not be described again as appropriate. In the induction motor, the teeth of a stator core are parallel to the radial direction as shown in FIG. 3(a).

Figure 16:
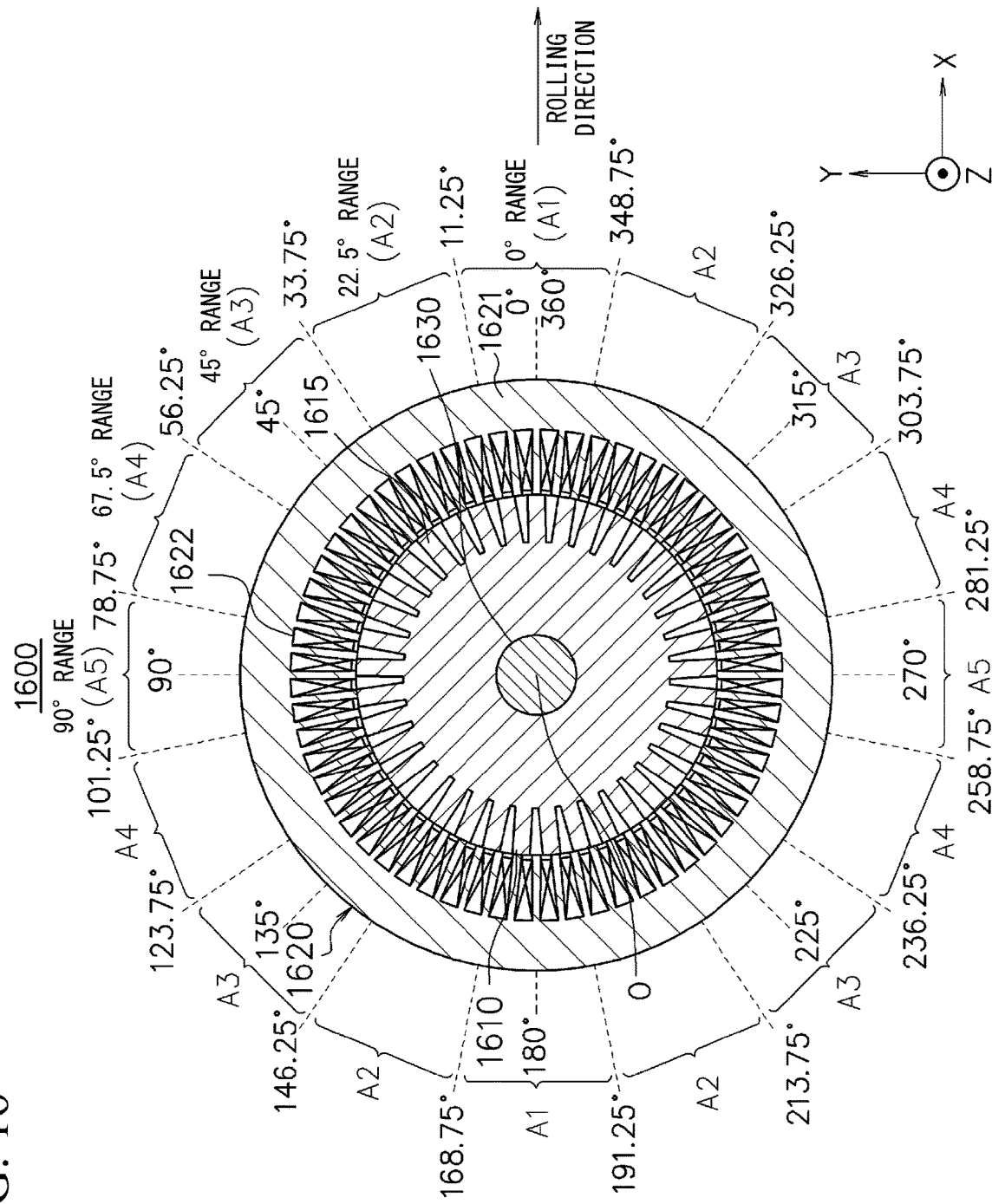
FIG. 16 is a view showing an example of the configuration of a motor.

FIG. 16 is a view showing an example of the configuration of a motor 1600 before the widths of teeth are determined, that is, the widths of the individual teeth are constant along the whole circumference. FIG. 16 shows a cross section of the motor 1600 cut perpendicular to the axis O.

In FIG. 16, the motor 1600 is an induction motor and has a rotor 1610 and a stator 1620.

The rotor 1610 is attached to a rotating shaft 1630 so as to be concentric with the rotating shaft 1630 (axis O). The rotor 1610 has a plurality of coils. As shown in FIG. 16, the number of poles in the motor 1600 is four. In addition, the outer diameter of the rotor 1610 is 134 [mm]

The stator 1620 has a stator core 1621 and a coil 1622. The outer diameter of the stator 1620 is 220 [mm], and the inner diameter of the stator 1620 is 136 [mm]. The number of slots in the stator core 1621 is 60. In addition, the coil 1622 is a distributed coiling.

Figures 17, 18:
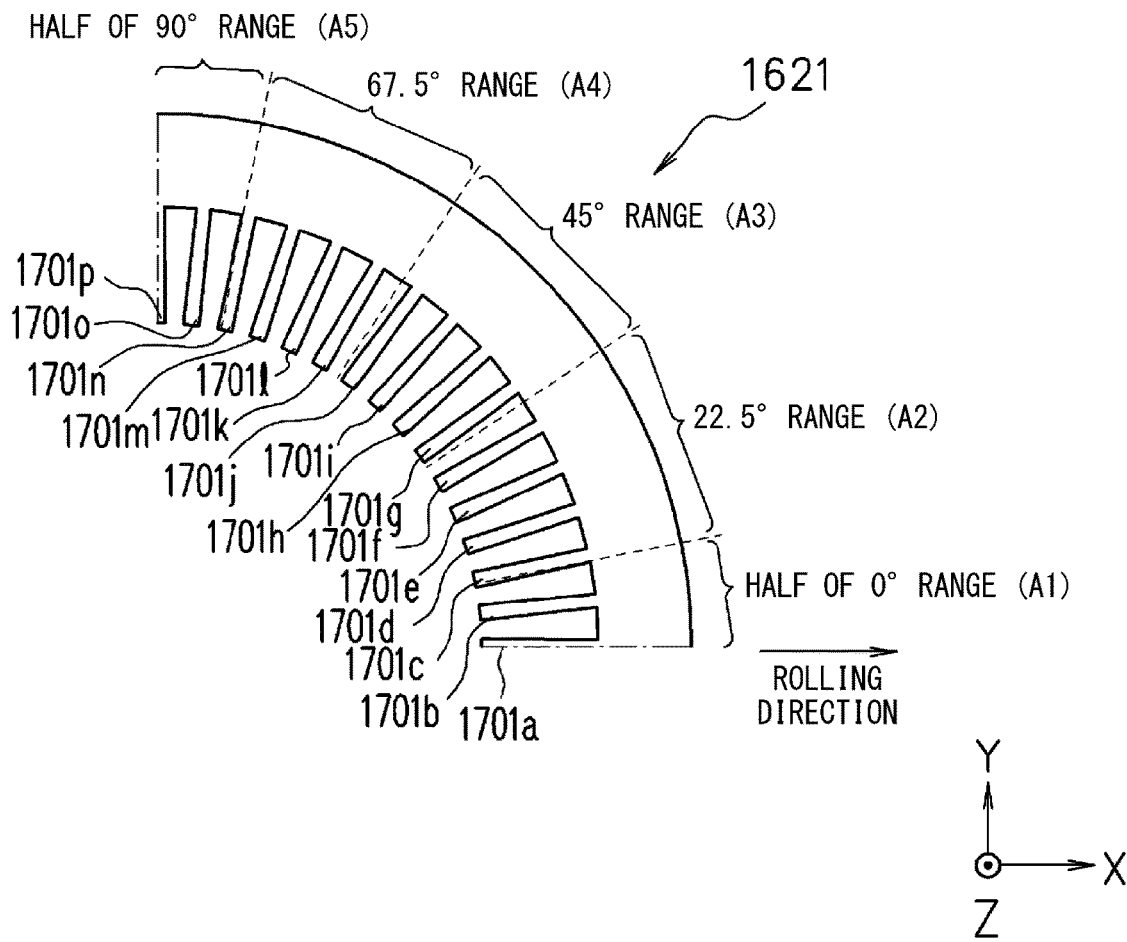
FIG. 17 is a view showing angles of 0° to 90° from the rolling direction in a stator core.
FIG. 18 is a table showing a relationship between a torque proportion and an average magnetic flux density in the teeth.

FIG. 17 is an enlarged view of a portion at angles of 0° to 90° from the rolling direction in the stator core 1621 of FIG. 16 extracted and enlarged. Here, among teeth 1701a to 1701p of the stator core 1621, the tooth 1701a is positioned at an angle of 0° from the rolling direction, and only ½ of the width of the tooth is shown. In addition, among the teeth 1701a to 1701p, the tooth 1701p is positioned at an angle of 90° from the rolling direction, and only ½ of the width of the tooth is shown. In addition, each tooth has a shape that is parallel to the radial direction as shown in FIG. 3(a). The width of each tooth is 4 mm.

Here, the analysis results of the relationship between an operating condition (torque proportion) and the average magnetic flux density in the teeth in a case where the rotation speed of the motor 1600 is set to 3,000 [rpm] and the widths of the teeth are constant along the whole circumference of the stator core 1621 are shown in FIG. 18.

FIG. 18 is a view showing the relationship between the torque proportion [%], which is an operating condition for the motor 1600, and the average magnetic flux density B $[T^{peak}]$ in the teeth.

From the average magnetic flux densities in the teeth shown in FIG. 18, the average magnetic field strengths H [A/m] of the teeth are calculated. Next, the magnetic flux density B [T] in the teeth at each angle from the rolling direction when the motor is excited with the average magnetic field strength of the teeth is calculated based on the material characteristics of the material A.

FIG. 19 is a table showing the relationship between the torque proportion [%] and the magnetic flux density B [T] in the teeth at each angle from the rolling direction.

As shown in FIG. 19, at the torque proportions of 20 [%], 40 [%], 60 [%], and 80 [%], the magnetic flux density in the teeth at each angle from the rolling direction varies. In addition, at the torque proportions of 40 [%], 60 [%], and 80 [%], the magnetic flux densities in the teeth at angles of 0° and 90° from the rolling direction are large, and the magnetic flux density in the teeth at an angle of 45° from the rolling direction is small. Such a tendency coincides with the tendency that the B50 proportion is large at angles of 0° and 90° from the rolling direction and the B50 proportion is small at an angle of 45° from the rolling direction as shown by Graph 201 of the material A shown in FIG. 2. On the other hand, as shown in FIG. 19, at the torque proportion of 100 [%], since the motor is magnetically saturated, the magnetic flux density in the teeth is substantially constant regardless of the angles from the rolling direction.

Next, based on the magnetic flux density in the teeth at each angle from the rolling direction shown in FIG. 19, the widths of the teeth are determined such that "width of tooth"דmagnetic flux density in tooth" becomes substantially constant in each tooth.

FIG. 20 is a table showing the relationship between the torque proportion [%] and the optimum width [mm] of the tooth determined for each angle from the rolling direction.

For example, when a case where the torque proportion is 60 [%] in FIG. 20 is taken as an example, the optimum width of the tooth is 3.85 [mm] at an angle of 0° from the rolling direction, the optimum width of the tooth is 3.96 [mm] at an angle of 22.5°, the optimum width of the tooth is 4.08 [mm] at an angle of 45°, the optimum width of the tooth is 4.06 [mm] at an angle of 67.5°, and the optimum width of the tooth is 3.96 [mm] at an angle of 90°. Here, the products obtained by multiplying "magnetic flux density in tooth" in a case where the torque proportion is 60 [%] in FIG. 19 by "optimum width of tooth" in a case where the torque proportion is 60 [%] in FIG. 20 at each angle from the rolling direction are all 6.7 and substantially constant.

The optimum widths of the teeth determined as described above are applied to the widths of the teeth according to the angles from the rolling direction, thereby designing a stator core.

For example, when a case where the torque proportion is 60 [%] in FIG. 20 is taken as an example, a stator core is designed by setting the widths of the teeth 1701a and 1701b that are included in the 0° range (A1) shown in FIG. 17 to 3.85 [mm], the widths of the teeth 1701c to 1701f that are included in the 22.5° range (A2) to 3.96 [mm], the widths of the teeth 1701g to 1701i that are included in the 45° range (A3) to 4.08 [mm], the widths of the teeth 1701k to 1701n that are included in the 67.5° range (A4) to 4.06 [mm], and the widths of the teeth 17010 and 1701p that are included in the 90° range (A5) to 3.96 [mm].

In addition, since the magnetic flux density B [T] in the teeth at each angle from the rolling direction shown in FIG. 19 is substantially the same not only in a range of the angle 0° from the rolling direction (angles of 11.25° to 33.75°: A1) but also at angles of 168.75° to 191.25° shown in FIG. 16, teeth that are included at the angles of 168.75° to 191.25° are also designed to have substantially the same widths as the widths of the teeth that are included in the 0° range (A1).

Similarly, teeth that are included at angles of 146.25° to 168.75°, 191.25° to 213.75°, and 326.25° to 348.75° shown in FIG. 16 are also designed to have substantially the same widths as the widths of the teeth that are included in the 22.5° range (A2).

Similarly, teeth that are included at angles of 123.75° to 146.25°, 213.75° to 236.25°, and 303.75° to 326.25° shown in FIG. 16 are also designed to have substantially the same widths as the widths of the teeth that are included in the 45° range (angles of 33.75° to 56.25°: A3).

Similarly, teeth that are included at angles of 101.25° to 123.75°, 236.25° to 258.75°, and 281.25° to 303.75° shown in FIG. 16 are also designed to have substantially the same widths as the widths of the teeth that are included in the 67.5° range (angles of 56.25° to 78.75°: A4).

Similarly, teeth that are included at angles of 258.75° to 281.25° shown in FIG. 16 are also designed to have substantially the same widths as the widths of the teeth that are included in the 90° range (78.75° to 101.25°: A5).

The tooth 1701c that is positioned between the 0° range (A1) and the 22.5° range (A2) is regarded as being in the 22.5° range, but may be regarded as being in the 0° range. In addition, the tooth 1701n that is positioned at the boundary between the 67.5° range (A4) and the 90° range (A5) is regarded as being in the 67.5° range, but may be regarded as being in the 90° range.

FIG. 21 is a table showing the relationship of the iron loss proportion [−] between a stator core in which the widths of the teeth are designed to be the optimum widths of each torque proportion [%] and a stator core in which the widths of the teeth are set to be constant along the whole circumference.

From the results of the iron loss proportion shown in FIG. 21, it is possible to confirm that, at the torque proportions of 20 [%], 40 [%], 60 [%], and 80 [%], iron losses of 0.1 [%] to 1.4 [%] can be suppressed. On the other hand, at the torque proportion of 100 [%], since the motor was magnetically saturated, and the magnetic flux density in the teeth was substantially constant regardless of the angles from the rolling direction, it was not possible to confirm an effect by which iron losses could be suppressed.

Next, the optimum width of the tooth at each angle from the rolling direction is weighted based on the proportion of the operating time according to the torque proportion shown in FIG. 10 in the same manner as in the above-described [second design method for stator core].

FIG. 22 is a table showing the widths of the teeth weighted based on the proportion of the operating time shown in FIG. 10 at each angle from the rolling direction.

Here, a motor including a stator core designed to have the widths of the teeth weighted as shown in FIG. 22 was regarded as an invention example, and a motor including a stator core in which the widths of the teeth were set to be constant along the whole circumference was regarded as a comparative example. The iron loss proportion at the time of operating each of the motors at the rotation speed of 3,000 [rpm] and the proportion of the operating time shown in FIG. 10 was 0.995, and it was possible to confirm that the iron loss could be suppressed to 0.5 [%].

<Example of Determining Width of Tooth (Tooth Parallel to Radial Direction (Material B))>

Next, an example of determining the width of a tooth such that the above-described "width of tooth"×"magnetic flux density in tooth" becomes substantially constant in each tooth in a case where the electrical steel sheet is the material B and a stator core for an induction motor is designed will be described. The same contents as the above-described <example of determining width of tooth (tooth parallel to radial direction (material A))> will not be described again as appropriate.

Here, the analysis results of the relationship between an operating condition (torque proportion) and the average magnetic flux density in the teeth in a case where the rotation speed of the motor 1600 shown in FIG. 16 is set to 3,000 [rpm] and the widths of the teeth are constant along the whole circumference of the stator core 1621 are the same as in FIG. 18.

From the average magnetic flux densities in the teeth shown in FIG. 18, the average magnetic field strengths H [A/m] of the teeth are calculated. Next, the magnetic flux density B [T] in the teeth at each angle from the rolling direction when the motor is excited with the average magnetic field strength of the teeth is calculated based on the material characteristics of the material B.

FIG. 23 is a table showing the relationship between the torque proportion [%] and the magnetic flux density B [T] in the teeth at each angle from the rolling direction.

As shown in FIG. 23, at all of the torque proportions, the magnetic flux density in the teeth at each angle from the rolling direction varies. In addition, at all of the torque proportions, the magnetic flux density in the teeth at an angle of 45° from the rolling direction is large, and the magnetic flux densities in the teeth at angles of 0° and 90° from the rolling direction is small. Such a tendency coincides with the tendency that the B50 proportion is large at an angle of 45° from the rolling direction and the B50 proportion is small at angles of 0° and 90° from the rolling direction as shown by Graph 202 of the material B shown in FIG. 2.

Next, based on the magnetic flux density in the teeth at each angle from the rolling direction shown in FIG. 23, the widths of the teeth are determined such that "width of tooth"×"magnetic flux density in tooth" becomes substantially constant in each tooth.

FIG. 24 is a table showing the relationship between the torque proportion [%] and the optimum width [mm] of the tooth determined for each angle from the rolling direction.

FIG. 25 is a table showing the relationship of the iron loss proportion [−] between a stator core in which the widths of the teeth are designed to be the optimum widths of each torque proportion [%] and a stator core in which the widths of the teeth are set to be constant along the whole circumference.

From the results of the iron loss proportion shown in FIG. 25, it is possible to confirm that, at the torque proportions of 20 [%], 40 [%], 60 [%], and 80 [%], iron losses of 1.1 [%] to 5.6 [%] can be suppressed. On the other hand, at the torque proportion of 100 [%], since the motor was magnetically saturated, and the magnetic flux density in the teeth was substantially constant regardless of the angles from the rolling direction, it was not possible to confirm an effect by which iron losses could be suppressed.

It was possible to confirm that, when the width of each tooth is determined such that "width of tooth"×"magnetic flux density in tooth" becomes substantially constant in each tooth depending on the operating condition such as the torque proportion, it is possible to reduce the variation in the magnetic flux density and to suppress iron losses in regions where the motor is not magnetically saturated.

Next, the optimum width of the tooth at each angle from the rolling direction is weighted based on the proportion of the operating time according to the torque proportion shown in FIG. 10 in the same manner as in the above-described [second design method for stator core].

Figures 26, 27:
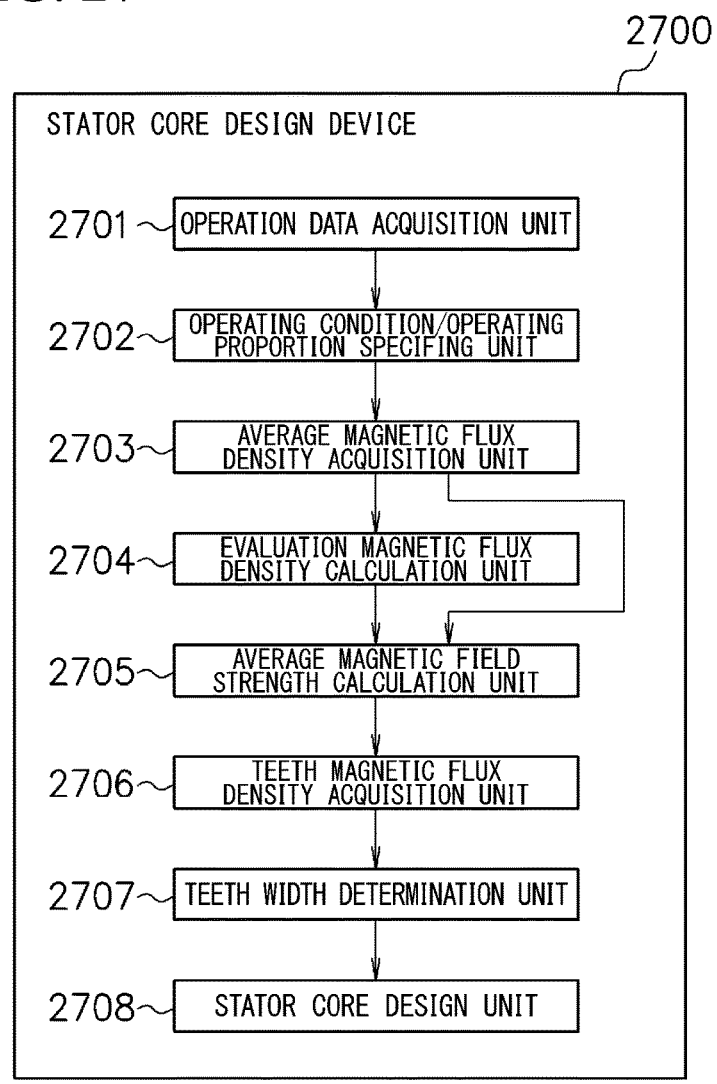
FIG. 26 is a table showing the widths of the teeth weighted based on the proportion of the operating time at each angle from the rolling direction (material B).
FIG. 27 is a view showing an example of the functional configuration of a stator core design device.

FIG. 26 is a table showing the widths of the teeth weighted based on the proportion of the operating time shown in FIG. 10 at each angle from the rolling direction.

Here, a motor including a stator core designed to have the widths of the teeth weighted as shown in FIG. 26 was regarded as an invention example, and a motor including a stator core in which the widths of the teeth were set to be constant along the whole circumference was regarded as a comparative example. The iron loss proportion at the time of operating each of the motors at the rotation speed of 3,000 [rpm] and the proportion of the operating time shown in FIG. 10 was 0.972, and it was possible to confirm that the iron loss could be suppressed to 2.8 [%].

<Stator Core Design Device>

Next, cases where the above-described [first design method for stator core] and [second design method for stator core] are performed using a stator core design device 2700 will be described. The hardware of the stator core design device 2700 is realized using, for example, an information processing device having a CPU, a ROM, a RAM, an HDD, and a variety of hardware or dedicated hardware.

FIG. 27 is a view showing an example of the mechanism configuration of the stator core design device 2700.

The stator core design device 2700 has an operation data acquisition unit 2701, an operating condition/operating proportion specifying unit 2702, an average magnetic flux density acquisition unit 2703, an evaluation magnetic flux density calculation unit 2704, an average magnetic field strength calculation unit 2705, a teeth magnetic flux density acquisition unit 2706, a teeth width determination unit 2707, and a stator core design unit 2708.

Figure 28:
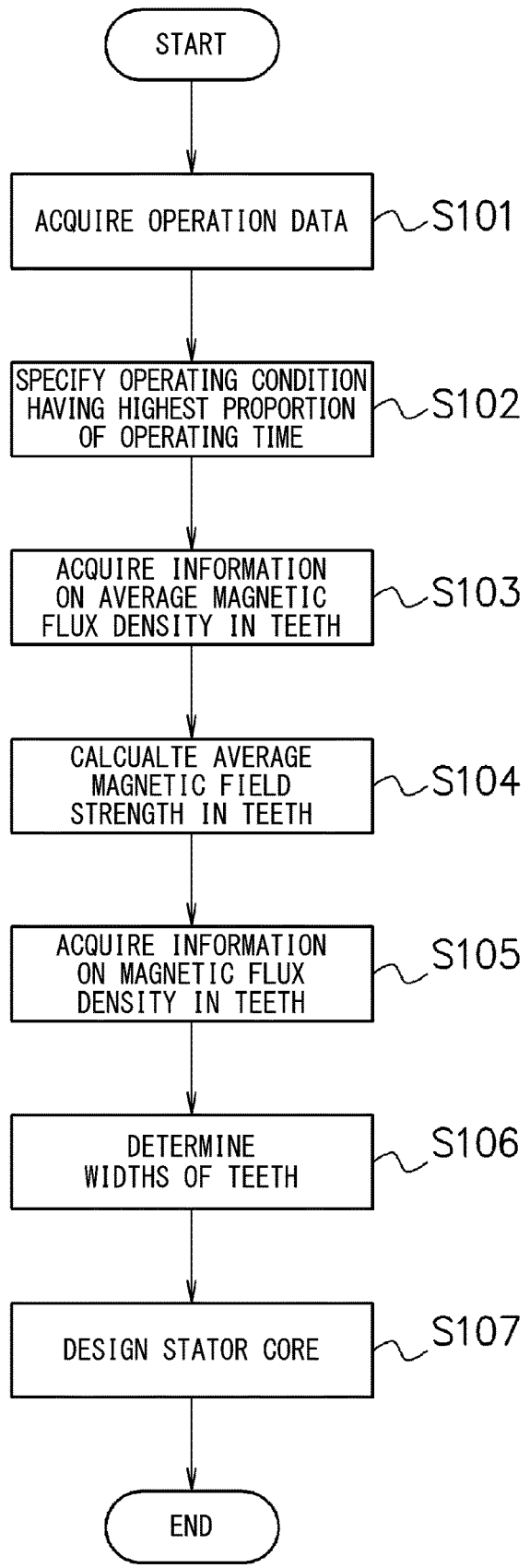
FIG. 28 is a flowchart showing an example of processes in the stator core design device.

FIG. 28 is a flowchart showing an example of processes in the stator core design device 2700. The flowchart of FIG. 28 shows an example in which the above-described [first design method for stator core] is realized with the stator core design device 2700. The same description as the above description will not be repeated as appropriate.

In S101, the operation data acquisition unit 2701 acquires the operation data of the rotary electric machine including the stator core to be designed in the case of operating the rotary electric machine. That is, the operation data acquisition unit 2701 acquires the operation data in a case where the rotary electric machine including a stator core to be designed is supposed to be operated.

As described above, the operation data includes planned data and actual data. The operation data acquisition unit 2701 acquires the planned data in the case of a rotary electric machine whose operation has been determined in advance and acquires actual data in a case where the same type of rotary electric machines have been already operated and accumulated as achievements. The operation data acquisition unit 2710 may acquire the operation data of either planned data or actual data or may acquire the operation data of at least one of planned data and actual data. With the process of S101, for example, the operation data shown in FIG. 10 is acquired.

In S102, the operating condition/operating proportion specifying unit 2702 specifies an operating condition having the highest proportion of the operating time among a plurality of operating conditions based on the operation data acquired in S101. With the process of S102, for example, a torque proportion of 30 [%] to 50 [%], that is, a torque proportion of 40 [%] is specified as the operating condition having the highest proportion of operating time based on the operation data shown in FIG. 10.

In S103, the average magnetic flux density acquisition unit 2703 acquires information on the average magnetic flux density in the teeth corresponding to the operating condition specified in S102. Specifically, the average magnetic flux density acquisition unit 2703 acquires the average magnetic flux density in the teeth which is the operating condition specified in S102 and is derived by performing electromagnetic field analysis (numerical value analysis) based on Maxwell's equations or by actually measuring induced voltages using search coils and integrating the induced voltages in a case where the widths of the teeth are constant along the whole circumference of the stator core.

With the process of S103, for example, as in the relationship between the torque proportion and the average magnetic flux density in the teeth shown in FIG. 6, an average magnetic flux density in the teeth of 1.44 [$T^{peak}$] that corresponds to the torque proportion of 40 [%], which is the operating condition having the highest proportion of the operating time, is acquired.

In S104, the average magnetic field strength calculation unit 2705 calculates the average magnetic field strength of the teeth from the information on the average magnetic flux density in the teeth acquired in S103. The average magnetic field strength of the teeth can be calculated based on the relative magnetic permeability of the electrical steel sheet.

In S105, the teeth magnetic flux density acquisition unit 2706 acquires information on the magnetic flux density in the teeth when the rotary electric machine is excited by the average magnetic field strength of the teeth calculated in S104. Specifically, the teeth magnetic flux density acquisition unit 2706 acquires the magnetic flux density B [T] of the teeth at each angle from the rolling direction when the rotary electric machine is excited by the average magnetic field strength of the teeth based on material characteristics, more specifically, the B-H characteristics of the electrical steel sheet at each angle from the rolling direction.

With the process of S105, for example, the magnetic flux densities of the teeth of 1.51 [T], 1.47 [T], 1.42 [T], 1.42 [T], and 1.44 [T] at the angles from the rolling direction of 0°, 22.5°, 45°, 67.5°, and 90° are acquired at the torque proportion of 40 [%], which is the operating condition having the highest proportion of the operating time shown in FIG. 7.

In S106, the teeth width determination unit 2707 determines the widths of the teeth such that the product of "width of tooth" and "magnetic flux density in tooth" acquired in S105 becomes substantially constant in each tooth. The widths of the teeth determined as described above are the optimum widths of the teeth.

With the process of S106, for example, the optimum widths of the teeth of 5.57 [mm], 5.72 [mm], 5.95 [mm], 5.93 [mm], and 5.85 [mm] at the angles from the rolling direction of 0°, 22.5°, 45°, 67.5°, and 90° are determined at the torque proportion of 40 [%], which is the operating condition having the highest proportion of the operating time as shown in FIG. 8.

In S107, the stator core design unit 2708 designs a stator core by applying the determined optimum widths of the teeth to the widths of the teeth according to the angles from the rolling direction.

With the process of S107, a stator core is designed by applying, for example, the optimum widths of the teeth at the angles from the rolling direction of 0°, 22.5°, 45°, 67.5°, and 90° to the widths of the teeth that are included in the 0° ranges (two A1's), the 22.5° ranges (four A2's), the 45° ranges (four A3's), the 67.5° range (four A4's), and the 90 range (two A5's) shown in FIG. 4.

When a stator core is designed with the stator core design device 2700 as described above, it is possible to reduce the variation in the magnetic flux density and to suppress iron losses under the operating conditions with the highest proportion of the operating time.

In the above description, a case where the operating condition having the highest proportion of the operating time among the plurality of operating conditions is specified in S102, the information on the average magnetic flux density in the teeth that correspond to the specified operating condition is acquired in S103, and the average magnetic field strength of the teeth is calculated from the information on the average magnetic flux density in the teeth in S104 has been described, but the configuration is not limited to this case. For example, the teeth magnetic flux density acquisition unit 2706 of the stator core design device 2700 may acquire the information on the average magnetic field strength of the teeth by causing an operator of the stator core design device 2700 to input a predetermined magnetic field strength without performing the processes of S101 to S104. In this case, in S105, the teeth magnetic flux density acquisition unit 2706 is capable of acquiring the information on the input average magnetic field strength of the teeth and acquiring the magnetic flux density in the teeth from the acquired information on the average magnetic field strength of the teeth.

Figure 29:
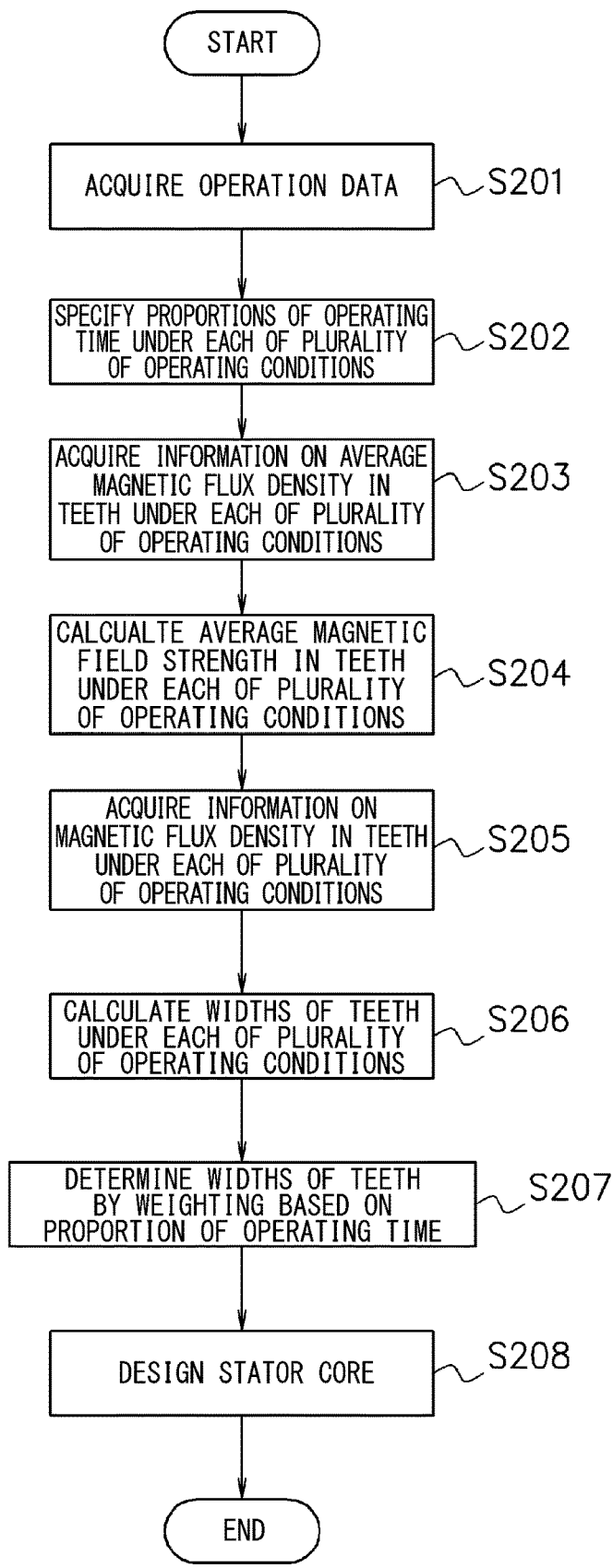
FIG. 29 is a flowchart showing an example of the processes in the stator core design device.

FIG. 29 is a flowchart showing another example of the processes in the stator core design device 2700. The flowchart of FIG. 29 shows an example in which the above-described [second design method for stator core] is realized with the stator core design device 2700. The same processes as in the flowchart of FIG. 28 will not be described again as appropriate.

In S201, the operation data acquisition unit 2701 acquires the operation data of the rotary electric machine including the stator core to be designed in the case of operating the rotary electric machine. This process is the same as the process of S101. With the process of S201, for example, the operation data shown in FIG. 10 is acquired.

In S202, the operating condition/operating proportion specifying unit 2702 specifies the proportions of the operating time for each of a plurality of operating conditions based on the operation data acquired in S101. With the process of S202, for example, the proportions of the operating time according to the torque proportions are specified based on the operation data shown in FIG. 10.

In S203, the average magnetic flux density acquisition unit 2703 acquires information on the average magnetic flux density in the teeth corresponding to each of the plurality of operating conditions. Specifically, the average magnetic flux density acquisition unit 2703 acquires the average magnetic flux density in the teeth under each of the plurality of operating conditions, under each of the plurality of operating conditions, by performing electromagnetic field analysis (numerical value analysis) based on Maxwell's equations or by actually measuring induced voltages using search coils and integrating the induced voltages in a case where the widths of the teeth are constant along the whole circumference of the stator core.

With the process of S203, for example, as in the relationship between the torque proportion and the average magnetic flux density in the teeth shown in FIG. 6, is acquired at each torque proportion.

In S204, the average magnetic field strength calculation unit 2705 calculates the average magnetic field strength of the teeth under each of the plurality of operating conditions from the information on the average magnetic flux density in the teeth corresponding to each of the plurality of operating conditions that are acquired in S203. The average magnetic field strength of the teeth can be calculated based on the relative magnetic permeability of the electrical steel sheet.

In S205, the teeth magnetic flux density acquisition unit 2706 acquires information on the magnetic flux density in the teeth under each of the plurality of operating conditions when the rotary electric machine is excited by the average magnetic field strength of the teeth under each of the plurality of operating conditions that are calculated in S204. Specifically, the teeth magnetic flux density acquisition unit 2706 acquires the magnetic flux density B [T] of the teeth at each angle from the rolling direction when the rotary electric machine is excited by the average magnetic field strength of the teeth for each of the plurality of operating conditions based on material characteristics, more specifically, the B-H characteristics of the electrical steel sheet at each angle from the rolling direction.

With the process of S205, for example, the magnetic flux densities of the teeth at the angles of 0°, 22.5°, 45°, 67.5°, and 90° from the rolling direction are acquired at each torque proportion as shown in FIG. 7.

In S206, the teeth width determination unit 2707 calculates the widths of the teeth under each of the plurality of operating conditions such that the product of "width of tooth" and "magnetic flux density in tooth" acquired in S205 becomes substantially constant in each tooth. The widths of the teeth calculated as described above are the optimum widths of the teeth.

With the process of S206, for example, the optimum widths of the teeth at the angles of 0°, 22.5°, 45°, 67.5°, and 90° from the rolling direction are calculated at each torque proportion as shown in FIG. 8.

In S207, the teeth width determination unit 2707 determines the weighted widths of the teeth by weighting the optimum width of the teeth for each of the plurality of operating conditions that are calculated in S206 based on the proportion of the operating time for each of the plurality of operating conditions specified in S202.

With the process of S207, for example, the widths of the teeth weighted based on the proportion of the operating time are determined as shown in FIG. 11.

In S208, the stator core design unit 2708 designs a stator core by applying the weighted widths of the teeth to the widths of the teeth according to the angles from the rolling direction.

With the process of S208, a stator core is designed by applying, for example, the widths of the teeth weighted at the angles from the rolling direction of 0°, 22.5°, 45°, 67.5°, and 90° to the widths of the teeth that are included in the 0° ranges (two A1's), the 22.5° ranges (four A2's), the 45° ranges (four A3's), the 67.5° range (four A4's), and the 90° range (two A5's) shown in FIG. 4.

When a stator core is designed with the stator core design device 2700 as described above, it is possible to reduce the variation in the magnetic flux density and to suppress iron losses for the entire operating time.

In the flowchart of FIG. 29, a case where the optimum widths of the teeth for each of the plurality of operating conditions are weighted based on the proportion of the operating time for each of the plurality of operating conditions in S207 has been described, but the configuration is not limited to this case.

Figure 30:
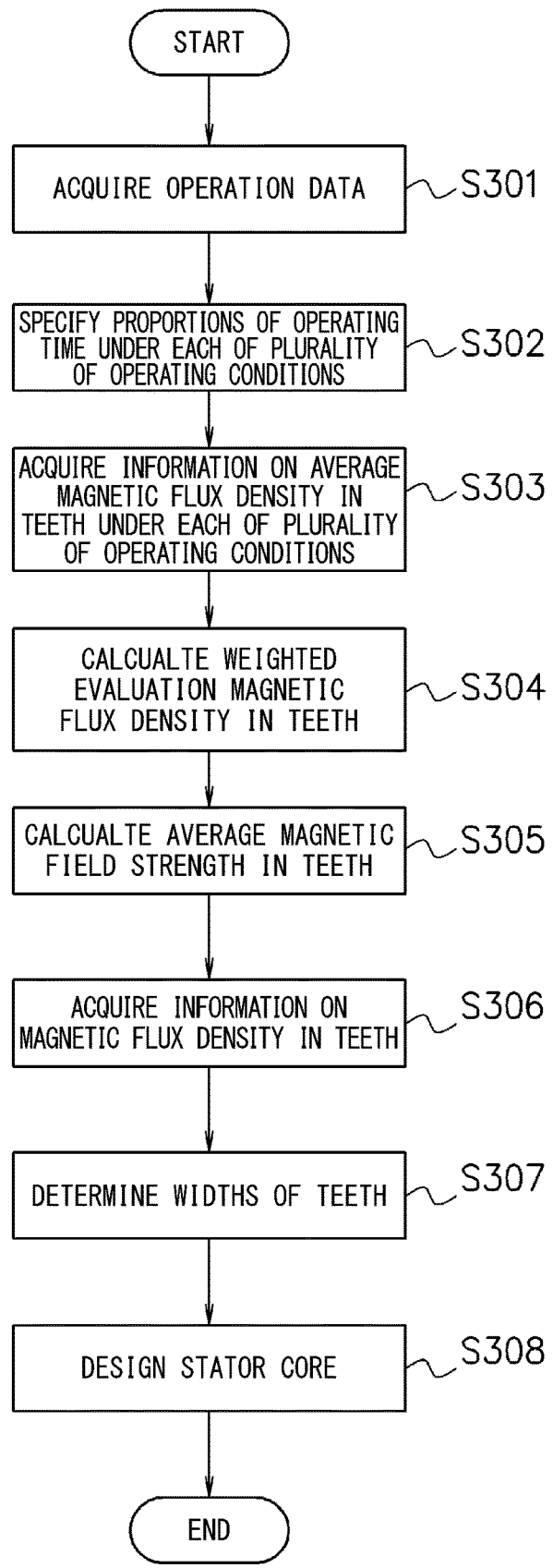
FIG. 30 is a flowchart showing an example of the processes in the stator core design device.

FIG. 30 is a flowchart showing still another example of the processes in the stator core design device 2700. The flowchart of FIG. 30 shows an example in which a method that is different from the above-described [second design method for stator core] is realized with the stator core design device 2700. The same processes as in the flowchart of FIG. 28 and the flowchart of FIG. 29 will not be described again as appropriate.

In S301, the operation data acquisition unit 2701 acquires the operation data of the rotary electric machine including the stator core to be designed in the case of operating the rotary electric machine. This process is the same as the processes of S101 and S201. With the process of S301, for example, the operation data shown in FIG. 10 is acquired.

In S302, the operating condition/operating proportion specifying unit 2702 specifies the proportions of the operating time for each of a plurality of operating conditions based on the operation data acquired in S301. This process is the same as the process of S202.

In S303, the average magnetic flux density acquisition unit 2703 acquires information on the average magnetic flux density in the teeth corresponding to each of the plurality of operating conditions. This process is the same process as S203. With the process of S303, for example, as in the relationship between the torque proportion and the average magnetic flux density in the teeth shown in FIG. 6, is acquired at each torque proportion.

In S304, the evaluation magnetic flux density calculation unit 2704 calculates the evaluation magnetic flux density in the teeth weighted based on the proportion of the operating time specified in S302 from the information on the average magnetic flux density in the teeth that corresponds to each of the plurality of operating conditions acquired in S303. The evaluation magnetic flux density is the magnetic flux density in the teeth obtained by weighting the average magnetic flux density in the teeth based on the proportion of the operating time. Specifically, the evaluation magnetic flux density calculation unit 2704 is capable of calculating the evaluation magnetic flux density by multiplying the average magnetic flux density in the teeth and the proportion of the operating time at each torque proportion, adding the multiplied values, and dividing the added value by 100.

For example, in the case of the relationship between the torque proportion and the average magnetic flux density in the teeth as shown in FIG. 6 and the operation data as shown in FIG. 10, the evaluation magnetic flux density By [$T^{peak}$] in the teeth is calculated by dividing (1.22 [$T^{peak}$]×20 [%]+1.44 [$T^{peak}$]×45 [%]+1.59 [$T^{peak}$]×20 [%]+1.82 [$T^{peak}$]×10 [%]+2.04 [$T^{peak}$]×5 [%]) by 100 with the process of S304.

In S305, the average magnetic field strength calculation unit 2705 calculates the average magnetic field strength of the teeth from the evaluation magnetic flux density in the teeth calculated in S304. The average magnetic field strength of the teeth can be calculated based on the relative magnetic permeability of the electrical steel sheet.

In S306, the teeth magnetic flux density acquisition unit 2706 acquires information on the magnetic flux density in the teeth when the rotary electric machine is excited by the average magnetic field strength of the teeth calculated in S305. This process is the same process as S105.

In S307, the teeth width determination unit 2707 determines the widths of the teeth such that the product of "width of tooth" and "magnetic flux density in tooth" acquired in S306 becomes substantially constant in each tooth. This process is the same process as S106.

With the process of S307, for example, the widths of the teeth weighted based on the proportion of the operating time are determined as shown in FIG. 11.

In S308, the stator core design unit 2708 designs a stator core by applying the determined widths of the teeth to the widths of the teeth according to the angles from the rolling direction. This process is the same process as S107.

When a stator core is designed with the stator core design device 2700 as described above, it is possible to reduce the variation in the magnetic flux density and to suppress iron losses for the entire operating time. In addition, when the evaluation magnetic flux density in the teeth obtained by weighting the average magnetic flux density in the teeth based on the proportion of the operating time is calculated, and the subsequent process is performed based on the calculated evaluation magnetic flux density in the teeth, it is possible to reduce the process.

As described above, according to the present embodiment, when the widths of the teeth are determined such that "width of tooth"ב"magnetic flux density in tooth" becomes substantially constant in each tooth, it is possible to reduce the variation in the magnetic flux density to suppress iron losses.

Each tooth may be each of teeth at predetermined intervals such as the angles of 0°, 22.5°, 45°, 67.5°, and 90° from the rolling direction as described above or may be all of the teeth. In addition, the expression "being substantially constant" does not only refer to the case of being completely constant, but also refers to the case of being substantially constant to an extent that the iron loss can be suppressed more than in comparative examples. Specifically, the expression "being substantially constant" means that the difference between the maximum value and the minimum value of "width of tooth"ב"magnetic flux density in tooth" is within ±1% and preferably within ±0.5%. As described above, it has been described that the products obtained by multiplying "magnetic flux density in tooth" in a case where the torque proportion is 60 [%] in FIG. 7 by "optimum width of tooth" in a case where the torque proportion is 60 [%] in FIG. 8 at each angle from the rolling direction are all 9.3 and substantially constant. Specifically, at the angle of 0° from the rolling direction, the magnetic flux density in the teeth of 1.65 [T]×the optimum width of the teeth of 5.64 [mm] =9.306≅9.3, at the angle from the rolling direction of 22.5°, the magnetic flux density in the teeth of 1.61 [T]×the optimum width of the teeth of 5.76 [mm]=9.2736≅9.3, at the angle of 45° from the rolling direction, the magnetic flux density in the teeth of 1.55 [T]×the optimum width of the teeth of 5.99 [mm]=9.2845≅9.3, at the angle of 67.5° from the rolling direction, the magnetic flux density in the teeth of 1.56 [T]×the optimum width of the teeth of 5.96 [mm] =9.2976≅9.3, and, at the angle of 90° from the rolling direction, the magnetic flux density in the teeth of 1.59 [T]×the optimum width of the teeth of 5.85 [mm] =9.3015≅9.3. In this case, the difference between the maximum value and the minimum value becomes 9.306÷ 9.2736=1.0035, and thus the degree of being substantially constant is within 0.5%. In addition, if a range of 9.25 to 9.34, which can be rounded off to 9.3, is allowed, 9.34÷9.25≅1.0097, and thus the degree of being substantially constant is within 1%.

Next, between the above-described electrical steel sheets, the material B is capable of suppressing iron losses more than the material A.

Here, the electrical steel sheet according to the material B will be described.

In the following description, a direction at an angle of 45° from the rolling direction will be referred to as the direction inclined by 45° from the rolling direction, and a direction at an angle of 135° from the rolling direction will be referred to as the direction inclined by 135° from the rolling direction. Additionally, a direction at an angle of θ° from the rolling direction will be referred to as the direction inclined by θ° from the rolling direction. As described above, the direction at an angle of θ° from the rolling direction and the direction inclined by θ° from the rolling direction have the same meaning.

First, the chemical composition of steel that is used in a non-oriented electrical steel sheet that is an example of the electrical steel sheet according to the material B (hereinafter, referred to as the non-oriented electrical steel sheet of the present embodiment) and a manufacturing method therefor will be described. In the following description, "%" that is the unit of the amount of each element that is contained in the non-oriented electrical steel sheet of the present embodiment or the steel means "mass %" unless particularly otherwise described. In addition, numerical limiting ranges described below using "to" include the lower limit value and the upper limit value in the ranges. Numerical values expressed with 'more than' or 'less than' are not included in numerical ranges. The non-oriented electrical steel sheet and the steel have a chemical composition in which ferrite-austenite transformation (hereinafter, α-γ transformation) can occur, C: 0.0100% or less, Si: 1.50% to 4.00%, sol. Al: 0.0001% to 1.0%, S: 0.0100% or less, N: 0.0100% or less, one or more selected from the group consisting of Mn, Ni, Co, Pt, Pb, Cu, and Au: 2.50% to 5.00% in total, Sn: 0.000% to 0.400%, Sb: 0.000% to 0.400%, P: 0.000% to 0.400%, and one or more selected from the group consisting of Mg, Ca, Sr, Ba, Ce, La, Nd, Pr, Zn, and Cd: 0.0000% to 0.0100% in total are contained, and the remainder includes Fe and impurities. Furthermore, the amounts of Mn, Ni, Co, Pt, Pb, Cu, Au, Si, and sol. Al satisfy predetermined conditions to be described below. Examples of the impurities are impurities that are contained in a raw material such as ore or a scrap or impurities that are contained during manufacturing steps.

<<C: 0.0100% or Less>>

C increases the iron loss or causes magnetic ageing. Therefore, the C content is preferably as small as possible. Such a phenomenon becomes significant when the C content exceeds 0.0100%. Therefore, the C content is set to 0.0100% or less. A reduction in the C content also contributes to uniform improvement in the magnetic characteristics in all directions in the sheet surface. The lower limit of the C content is not particularly limited, but is preferably set to 0.0005% or more based on the cost of a decarburization treatment at the time of refining.

<<Si: 1.50% to 4.00%>>

Si increases the electric resistance to decrease the eddy-current loss to reduce the iron loss or increases the yield ratio to improve blanking workability on iron cores. When the Si content is less than 1.50%, these action effects cannot be sufficiently obtained. Therefore, the Si content is set to 1.50% or more. On the other hand, when the Si content is more than 4.00%, the magnetic flux density decreases, the blanking workability deteriorates due to an excessive increase in hardness, or cold rolling becomes difficult. Therefore, the Si content is set to 4.00% or less.

<<Sol. Al: 0.0001% to 1.0%>> sol. Al increases the electric resistance to decrease the eddy-current loss to reduce the iron loss. sol. Al also contributes to improvement in the relative magnitude of a magnetic flux density B50 with respect to the saturated magnetic flux density. Here, the magnetic flux density B50 refers to a magnetic flux density when the tooth is excited with a magnetic field strength of 5000 A/m. When the sol. Al content is less than 0.0001%, these action effects cannot be sufficiently obtained. In addition, Al also has a desulfurization-accelerating effect in steelmaking. Therefore, the sol. Al content is set to 0.0001% or more. On the other hand, when the sol. Al content is more than 1.0%, the magnetic flux density decreases or the yield ratio is decreased to degrade the blanking workability. Therefore, the sol. Al content is set to 1.0% or less.

<<S: 0.0100% or Less>>

S is not an essential element and is contained in steel, for example, as an impurity. S causes the precipitation of fine MnS and thereby impairs recrystallization and the growth of crystal grains in annealing. Therefore, the S content is preferably as small as possible. An increase in the iron loss and a decrease in the magnetic flux density resulting from such impairing of recrystallization and crystal grain growth become significant when the S content is more than 0.0100%. Therefore, the S content is set to 0.0100% or less. The lower limit of the S content is not particularly limited, but is preferably set to 0.0003% or more based on the cost of a desulfurization treatment at the time of refining.

<<N: 0.0100% or Less>>

Similar to C, N degrades the magnetic characteristics, and thus the N content is preferably as small as possible. Therefore, the N content is set to 0.0100% or less. The lower limit of the N content is not particularly limited, but is preferably set to 0.0010% or more based on the cost of a denitrification treatment at the time of refining.

<<One or More Selected from the Group Consisting of Mn, Ni, Co, Pt, Pb, Cu, and Au: 2.50% to 5.00% in Total>>

Since these elements are necessary elements for causing α-γ transformation, these elements need to be contained in total of 2.50% or more. On the other hand, when the total exceeds 5.00%, there is a case where the cost increases and the magnetic flux density decreases. Therefore, the total of these elements is set to 5.00% or less.

In addition, as a condition for enabling the occurrence of the α-γ transformation, the chemical composition is made to further satisfy the following condition. That is, when the Mn content (mass %) is indicated by [Mn], the Ni content (mass %) is indicated by [Ni], the Co content (mass %) is indicated by [Co], the Pt content (mass %) is indicated by [Pt], the Pb content (mass %) is indicated by [Pb], the Cu content (mass %) is indicated by [Cu], the Au content (mass %) is indicated by [Au], the Si content (mass %) is indicated by [Si], and the sol. Al content (mass %) is indicated by [sol. Al], by mass %, Formula (1) below is preferably satisfied.

$$([Mn]+[Ni]+[Co]+[Pt]+[Pb]+[Cu]+[Au])-([Si]+[sol.Al])>0\% \quad (1).$$

In a case where Formula (1) is not satisfied, since α-γ transformation does not occur, the magnetic flux density decreases.

<<Sn: 0.000% to 0.400%, Sb: 0.000% to 0.400% and P: 0.000% to 0.400%>>

Sn or Sb improves the texture after cold rolling or recrystallization to improve the magnetic flux density. Therefore, these elements may be contained as necessary; however, when excessively contained, steel is embrittled. Therefore, the Sn content and the Sb content are both set to 0.400% or less. In addition, P may be contained to ensure the hardness of the steel sheet after recrystallization; however, when excessively contained, the embrittlement of steel is caused. Therefore, the P content is set to 0.400% or less. In the case of imparting an additional effect on the magnetic characteristics or the like as described above, one or more selected from the group consisting of 0.020% to 0.400% of Sn, 0.020% to 0.400% of Sb, and 0.020% to 0.400% of P is preferably contained.

<<One or More Selected from the Group Consisting of Mg, Ca, Sr, Ba, Ce, La, Nd, Pr, Zn, and Cd: 0.0000% to 0.0100% in Total>>

Mg, Ca, Sr, Ba, Ce, La, Nd, Pr, Zn, and Cd react with S in molten steel during the casting of the molten steel to generate the precipitate of a sulfide, an oxysulfide, or both. Hereinafter, Mg, Ca, Sr, Ba, Ce, La, Nd, Pr, Zn, and Cd will be collectively referred to as "coarse precipitate forming element" in some cases. The grain sizes in the precipitate of the coarse precipitate forming element are approximately 1 µm to 2 µm, which is significantly larger than the grain sizes (approximately 100 nm) in the fine precipitates of MnS, TiN, AlN, or the like. Therefore, these fine precipitates adhere to the precipitate of the coarse precipitate forming element and are less likely to impair recrystallization and the growth of crystal grains in annealing such as process annealing. In order to sufficiently obtain this action effect, the total of these elements is preferably 0.0005% or more. However, when the total of these elements exceeds 0.0100%, the total amount of the sulfide, the oxysulfide, or both becomes excessive, and recrystallization and the growth of crystal grains in process annealing are impaired. Therefore, the amount of the coarse precipitate forming element is set to 0.0100% or less in total.

<<Texture>>

Next, the texture of the non-oriented electrical steel sheet of the present embodiment will be described. The details of a manufacturing method will be described below, but the non-oriented electrical steel sheet of the present embodiment is a chemical composition in which a-γ transformation can occur and becomes a structure in which {100} crystal grains have grown by the refinement of the structure by rapid cooling immediately after finish rolling in hot rolling. Therefore, in the non-oriented electrical steel sheet of the present embodiment, the strength in a {100}<011> orientation becomes 5 to 30, and the magnetic flux density B50 in a 45° direction with respect to a rolling direction becomes particularly high. As described above, the magnetic flux density becomes high in a specific direction, but a high magnetic flux density can be obtained in all directions on average as a whole. When the strength in the {100}<011> orientation becomes less than 5, the strength in a {111}<112> orientation, which decreases the magnetic flux density, becomes high, and the magnetic flux density decreases as a whole. In addition, in a manufacturing method in which the strength in the {100}<011> orientation exceeds 30, it is necessary to thicken a hot-rolled sheet, which creates a problem of the manufacturing becoming difficult.

The strength in the {100}<011> orientation can be measured by an X-ray diffraction method or an electron backscatter diffraction (EBSD) method. Since the reflection angles or the like of X-rays and electron beams from samples differ depending on crystal orientations, crystal orientation strengths can be obtained from the reflection strength or the like based on a random orientation sample. The strength in the {100}<011> orientation of the preferable non-oriented electrical steel sheet of the present embodiment becomes 5 to 30 in terms of the X-ray random intensity ratio. At this time, crystal orientations may be measured by EBSD, and values converted to X-ray random intensity ratios may be used.

<<Thickness>>

Next, the thickness of the non-oriented electrical steel sheet of the present embodiment will be described. The thickness of the non-oriented electrical steel sheet of the present embodiment is 0.50 mm or less. When the thickness exceeds 0.50 mm, it is not possible to obtain an excellent high-frequency iron loss. Therefore, the thickness is set to 0.50 mm or less.

<<Magnetic Characteristics>>

Next, the magnetic characteristics of the non-oriented electrical steel sheet of the present embodiment will be described. At the time of investigating the magnetic characteristics, the value of B50, which is the magnetic flux density of the non-oriented electrical steel sheet of the present embodiment, is measured. In the manufactured non-oriented electrical steel sheet, one rolling direction and the other rolling direction cannot be distinguished. Therefore, in the present embodiment, the rolling direction refers to both the one rolling direction and the other rolling direction. When the value of B50 in the rolling direction is indicated by B50L, the value of B50 in a direction inclined by 45° from the rolling direction is indicated by B50D1, the value of B50 in a direction inclined by 90° from the rolling direction is indicated by B50C, and the value of B50 in a direction inclined by 135° from the rolling direction is indicated by B50D2, an anisotropy of the magnetic flux density in which B50D1 and B50D2 are the highest and B50L and B50C are the lowest is observed.

Here, in the case of considering, for example, an all-direction (0° to 360°) distribution of the magnetic flux density for which the clockwise (which may be counter-clockwise) direction is regarded as a positive direction, when the rolling direction is set to 0° (one direction) and 180° (the other direction), B50D1 becomes the B50 values at 45° and 225°, and B50D2 becomes the B50 values at 135° and 315°. Similarly, B50L becomes the B50 values at 0° and 180°, and B50C becomes the B50 values at 90° and 270°. The B50 value at 45° and the B50 value at 225° strictly coincide with each other, and the B50 value at 135° and the B50 value at 315° strictly coincide with each other. However, since there is a case where it is not easy to make the magnetic characteristics the same at the time of actual manufacturing, there is a case where B50D1 and B50D2 do not strictly coincide with each other. Similarly, there is a case where the B50 value at 0° and the B50 value at 180° strictly coincide with each other, and the B50 value at 90° and the B50 value at 270° strictly coincide with each other, but B50L and B50C do not strictly coincide with each other. In the non-oriented electrical steel sheet of the present embodiment, Formula (2) and Formula (3) below are satisfied using the average value of B50D1 and B50D2 and the average value of B50L and B50C.

$$(B50D1+B50D2)/2>1.7T \tag{2}$$

$$(B50D1+B50D2)/2>(B50L+B50C)/2 \tag{3}$$

When the magnetic flux density is measured as described above, the average value of B50D1 and B50D2 becomes 1.7T or more as in Formula (2), and a high anisotropy of the magnetic flux density as in Formula (3) is confirmed.

Furthermore, in addition to satisfying Formula (1), the anisotropy of the magnetic flux density is preferably higher than in Formula (3) as shown in Formula (4) below.

$$(B50D1+B50D2)/2>1.1\times(B50L+B50C)/2 \tag{4}$$

Furthermore, the anisotropy of the magnetic flux density is preferably higher as shown in Formula (5) below.

$$(B50D1+B50D2)/2>1.2\times(B50L+B50C)/2 \tag{5}$$

Furthermore, the average value of B50D1 and B50D2 preferably becomes 1.8T or more as shown in Formula (6) below.

$$(B50D1+B50D2)/2>1.8T \tag{6}$$

The above-described 45° is a theoretical value, and there is a case where it is not easy to match the rolling direction to 45° in actual manufacturing. Therefore, rolling directions that are not strictly matched to 45° are also regarded as the rolling direction at 45°. This is also true for the 0°, 90°, 135°, 180°, 225°, 270°, and 315°.

The magnetic flux density can be measured from 55 mm×55 mm samples cut out in directions at angles of 45°, 0°, and the like with respect to the rolling direction using a single sheet tester.

<<Manufacturing Method>>

Next, an example of a method for manufacturing the non-oriented electrical steel sheet of the present embodiment will be described. At the time of manufacturing the non-oriented electrical steel sheet of the present embodiment, for example, hot rolling, cold rolling (first cold rolling), process annealing (first annealing), skin pass rolling (second cold rolling), finish annealing (third annealing), stress relief annealing (second annealing), and the like are performed.

First, the above-described steel material is heated and hot-rolled. The steel is, for example, a slab that is manufactured by normal continuous casting. Rough rolling and finish rolling of the hot rolling are performed at temperatures in the γ range (Ar1 temperature or higher). That is, hot rolling is performed such that the finishing temperature of the finish rolling becomes the Ar1 temperature or higher, and the coiling temperature becomes higher than 250° C. and 600° C. or lower. Therefore, the steel transforms from austenite to ferrite by subsequent cooling, whereby the structure is refined. When subsequent cold rolling is performed in a state where the structure has been refined, swelling recrystallization (hereinafter, bulging) is likely to occur, and it is possible to facilitate the {100} crystal grains, which are, normally, difficult to grow.

In addition, at the time of manufacturing the non-oriented electrical steel sheet of the present embodiment, furthermore, a temperature (finishing temperature) when the steel passes through the final pass of finish rolling is set to the Ar1 temperature or higher, and the coiling temperature is set to higher than 250° C. and 600° C. or lower. The steel transforms from austenite to ferrite, whereby the crystal structure is refined. The crystal structure is refined as described above, whereby it is possible to facilitate the occurrence of bulging through the subsequent cold rolling and process annealing.

After that, the hot-rolled steel sheet is coiled and pickled without being annealed, and the hot-rolling steel sheet is cold-rolled. In the cold rolling, the rolling reduction is preferably set to 80% to 95%. At a rolling reduction of smaller than 85%, bulging is less likely to occur. At a rolling reduction of larger than 95%, it becomes easier for the {100} crystal grains to grow by subsequent bulging, but it is necessary to thicken the hot-rolled steel sheet, the coiling of the hot-rolled steel sheet becomes difficult, and operations are likely to become difficult. The rolling reduction of the cold rolling is more preferably 86% or larger. At a rolling reduction of the cold rolling of 86% or larger, bulging is more likely to occur.

When the cold rolling ends, subsequently, process annealing is performed. At the time of manufacturing the non-oriented electrical steel sheet of the present embodiment, process annealing is performed at a temperature at which the steel does not transform into austenite. That is, the temperature in the process annealing is preferably set to lower than the Ac1 temperature. When the process annealing is performed as described above, bulging occurs, and it becomes easy for the {100} crystal grains to grow. In addition, the time of the process annealing is preferably set to 5 seconds to 60 seconds.

When the process annealing ends, next, skin pass rolling is performed. When skin pass rolling and annealing are performed in a state where bulging has occurred as described above, the {100} crystal grains further grow from a portion where the bulging has occurred as a starting point. This is because the skin pass rolling makes it difficult for strains to be accumulated in the {100}<011> crystal grains and makes it easy for strains to be accumulated in the {111}<112> crystal grains, and, in the subsequent annealing, the {100}<011> crystal grains including a small number of strains intrude into the {111}<112> crystal grains using the difference in strains as a driving force. This intrusion phenomenon that is caused by the strain difference as the driving force is called strain-induced boundary migration (hereinafter, SIBM). The rolling reduction of skin pass rolling is preferably 5% to 25%. At a rolling reduction of smaller than 5%, since the strain amount is too small, SIBM does not occur in the subsequent annealing, and the {100}<011> crystal grains do not become large. On the other hand, at a rolling reduction of larger than 25%, the strain amount becomes too large, and recrystallization nucleation (hereinafter, nucleation) in which new crystal grains are formed in the {111}<112> crystal grains occurs. In this nucleation, since almost all grains that are newly formed are {111}<112> crystal grain, the magnetic characteristics become poor.

After the skin pass rolling, final annealing is performed to release strains and improve the workability. Similarly, the final annealing is also set to a temperature at which the steel does not transform into austenite, and the temperature of the final annealing is set to lower than the Ac1 temperature. When the final annealing is performed as described above, the {100}<011> crystal grains intrude the {111}<112> crystal grains, and the magnetic characteristics can be improved. In addition, at the time of the final annealing, a time taken for the temperature to reach 600° C. to the Ac1 temperature is set to 1200 seconds or shorter. When this annealing time is too short, almost all strains created by the skin pass remain, and the steel sheet warps when blanked into a complicated shape. On the other hand, when the annealing time is too long, crystal grains become too coarse, the droop surface becomes large at the time of blanking, and the blanking accuracy becomes poor.

When the finish annealing ends, the non-oriented electrical steel sheet is formed or the like in order to produce a desired iron and steel member. In addition, in order to remove strains or the like formed by forming or the like (for example, blanking) performed on the iron and steel member made of the non-oriented electrical steel sheet, stress relief annealing is performed on the iron and steel member. In the present embodiment, in order to cause SIBM at lower than the Ac1 temperature and to coarsen crystal grain sizes, the temperature of the stress relief annealing is set to, for example, approximately 800° C., and the time of the stress relief annealing is set to approximately two hours. The stress relief annealing makes it possible to improve the magnetic characteristics.

In the non-oriented electrical steel sheet (iron and steel member) of the present embodiment, the high B50 of Formula (1) and the excellent anisotropy of Formula (2) can be obtained mainly by the finish rolling that is performed at the Ar1 temperature or higher in the hot rolling step in the above-described manufacturing method. Furthermore, the rolling reduction in the skin pass rolling step is set to approximately 10%, whereby a more excellent anisotropy of Formula (4) can be obtained.

The Ai1 temperature in the present embodiment is obtained from a thermal expansion change of the steel (steel sheet) in the middle of cooling at an average cooling rate of 1° C./second. In addition, the Ac1 temperature in the present embodiment is obtained from a thermal expansion change of the steel (steel sheet) in the middle of heating at an average heating rate of 1° C./second.

The steel member made of the non-oriented electrical steel sheet of the present embodiment can be manufactured as described above.

Next, the non-oriented electrical steel sheet of the present embodiment will be specifically described while describing examples. The examples to be described below are simply examples of the non-oriented electrical steel sheet, and the non-oriented electrical steel sheet is not limited to the following examples.

First Example

Molten steel was cast, thereby producing ingots having components shown in Table 1 and Table 2 below. Here, the column "left side of formula" indicates the value of the left side of Formula (1) described above. After that, the produced ingots were hot-rolled by being heated up to 1150° C. and rolled such that the sheet thicknesses became 2.5 mm. In addition, after the end of finish rolling, the hot-rolled steel sheets were coiled. The temperatures (finishing temperatures) in a stage of the final pass of the finish rolling at this time were 830° C. and were all temperatures higher than the Ar1 temperature. For No. 108 where no γ-α transformation occurred, the finishing temperature was set to 850° C. In addition, regarding the coiling temperature, the hot-rolled steel sheets were coiled under the conditions shown in Table 1.

Next, the hot-rolled steel sheets were pickled to remove scales and cold-rolled in rolling reductions after the cold rolling shown in Table 1. In addition, process annealing was performed at 700° C. for 30 seconds in a non-oxidizing atmosphere. Next, rolling was performed in rolling reductions of the second round of cold rolling (skin pass rolling) shown in Table 1.

Next, in order to investigate the magnetic characteristics, after the second round of cold rolling (skin pass rolling), final annealing was performed at 800° C. for 30 seconds to produce 55 mm×55 mm samples by shearing, then, stress relief annealing was performed at 800° C. for two hours, and the magnetic flux densities B50 were measured. As the measurement samples, 55 mm×55 mm samples were collected in two directions at angles of 0° C. and 45° C. with respect to the rolling direction. In addition, these two types of samples were measured, and the magnetic flux densities B50 at 0°, 45°, 90°, and 135° with respect to the rolling direction were each regarded as B50L, B50D1, B50C, and B50D2.

TABLE 1

| | Component (wt %) | | | | | | | | | | | |
|---|---|---|---|---|---|---|---|---|---|---|---|---|
| No. | C | Si | sol-Al | S | N | Mn | Ni | Co | Pt | Pb | Cu | Au |
| 101 | 0.0008 | 2.52 | 0.010 | 0.0017 | 0.0019 | 3.12 | — | — | — | — | — | — |
| 102 | 0.0006 | 2.51 | 0.013 | 0.0017 | 0.0024 | — | 3.14 | — | — | — | — | — |
| 103 | 0.0007 | 2.48 | 0.013 | 0.0023 | 0.0017 | — | — | 3.07 | — | — | — | — |
| 104 | 0.0009 | 2.48 | 0.010 | 0.0023 | 0.0017 | — | — | — | 3.06 | — | — | — |
| 105 | 0.0008 | 2.48 | 0.010 | 0.0017 | 0.0017 | — | — | — | — | 3.12 | — | — |
| 106 | 0.0007 | 2.53 | 0.009 | 0.0020 | 0.0017 | — | — | — | — | — | 3.13 | — |
| 107 | 0.0012 | 2.47 | 0.009 | 0.0019 | 0.0022 | — | — | — | — | — | — | 3.06 |
| 108 | 0.0011 | 3.23 | 0.010 | 0.0020 | 0.0021 | 3.06 | — | — | — | — | — | — |
| 109 | 0.0012 | 2.49 | 0.301 | 0.0023 | 0.0022 | 3.36 | — | — | — | — | — | — |
| 110 | 0.0008 | 2.50 | 0.006 | 0.0022 | 0.0022 | 3.09 | — | — | — | — | — | — |
| 111 | 0.0009 | 2.54 | 0.010 | 0.0020 | 0.0022 | 3.13 | — | — | — | — | — | — |
| 112 | 0.0010 | 2.49 | 0.006 | 0.0022 | 0.0019 | 3.07 | — | — | — | — | — | — |
| 113 | 0.0007 | 2.48 | 0.014 | 0.0020 | 0.0019 | 3.14 | — | — | — | — | — | — |
| 114 | 0.0009 | 2.50 | 0.014 | 0.0024 | 0.0019 | 3.12 | — | — | — | — | — | — |
| 115 | 0.0013 | 2.48 | 0.011 | 0.0021 | 0.0023 | 3.10 | — | — | — | — | — | — |
| 116 | 0.0012 | 2.49 | 0.601 | 0.0020 | 0.0021 | 3.69 | — | — | — | — | — | — |
| 117 | 0.0008 | 2.50 | 0.600 | 0.0020 | 0.0019 | 3.69 | — | — | — | — | — | — |
| 118 | 0.0012 | 2.49 | 0.600 | 0.0020 | 0.0020 | 3.71 | — | — | — | — | — | — |
| 119 | 0.0009 | 2.52 | 0.599 | 0.0018 | 0.0018 | — | 3.70 | — | — | — | — | — |
| 120 | 0.0011 | 2.47 | 0.599 | 0.0019 | 0.0021 | — | — | 3.68 | — | — | — | — |
| 121 | 0.0012 | 2.53 | 0.599 | 0.0019 | 0.0020 | — | — | — | 3.69 | — | — | — |
| 122 | 0.0008 | 2.52 | 0.599 | 0.0020 | 0.0021 | — | — | — | — | 3.73 | — | — |
| 123 | 0.0012 | 2.48 | 0.604 | 0.0021 | 0.0020 | — | — | — | — | — | 3.71 | — |
| 124 | 0.0012 | 2.48 | 0.598 | 0.0021 | 0.0019 | — | — | — | — | — | — | 3.69 |
| 125 | 0.0011 | 2.49 | 0.600 | 0.0020 | 0.0019 | 3.68 | — | — | — | — | — | — |
| 126 | 0.0012 | 2.48 | 0.600 | 0.0019 | 0.0020 | 3.70 | — | — | — | — | — | — |
| 127 | 0.0010 | 2.50 | 0.602 | 0.0020 | 0.0019 | 3.69 | — | — | — | — | — | — |
| 128 | 0.0011 | 2.52 | 0.900 | 0.0018 | 0.0021 | 4.00 | — | — | — | — | — | — |
| 129 | 0.0010 | 2.49 | 0.600 | 0.0020 | 0.0021 | 3.72 | — | — | — | — | — | — |
| 130 | 0.0011 | 2.50 | 0.598 | 0.0022 | 0.0021 | 3.72 | — | — | — | — | — | — |

| | Component (wt %) | Hot rolling | | Cold rolling | | Second round of cold rolling |
|---|---|---|---|---|---|---|
| No. | Formula (1) | Coiling temperature | Sheet thickness | Rolling reduction | Sheet thickness | Rolling reduction |
| 101 | 0.60 | 500 | 2.5 | 85% | 0.385 | 9% |
| 102 | 0.62 | 500 | 2.5 | 85% | 0.385 | 9% |

TABLE 1-continued

| | | | | | | |
|---|---|---|---|---|---|---|
| 103 | 0.57 | 500 | 2.5 | 85% | 0.385 | 9% |
| 104 | 0.58 | 500 | 2.5 | 85% | 0.385 | 9% |
| 105 | 0.63 | 500 | 2.5 | 85% | 0.385 | 9% |
| 106 | 0.59 | 500 | 2.5 | 85% | 0.385 | 9% |
| 107 | 0.58 | 500 | 2.5 | 85% | 0.385 | 9% |
| 108 | −0.18 | 500 | 2.5 | 85% | 0.385 | 9% |
| 109 | 0.57 | 500 | 2.5 | 85% | 0.385 | 9% |
| 110 | 0.58 | 500 | 4.0 | 90% | 0.420 | 17% |
| 111 | 0.58 | 500 | 3.0 | 87% | 0.385 | 9% |
| 112 | 0.58 | 500 | 2.5 | 86% | 0.355 | 1% |
| 113 | 0.64 | 500 | 7.0 | 95% | 0.385 | 9% |
| 114 | 0.60 | 500 | 2.5 | 89% | 0.275 | 9% |
| 115 | 0.61 | 500 | 1.5 | 93% | 0.110 | 9% |
| 116 | 0.60 | 700 | 2.8 | 86% | 0.385 | 9% |
| 117 | 0.59 | 600 | 2.8 | 86% | 0.385 | 9% |
| 118 | 0.61 | 500 | 2.8 | 86% | 0.385 | 9% |
| 119 | 0.58 | 500 | 2.8 | 86% | 0.385 | 9% |
| 120 | 0.61 | 500 | 2.8 | 86% | 0.385 | 9% |
| 121 | 0.55 | 500 | 2.8 | 86% | 0.385 | 9% |
| 122 | 0.60 | 500 | 2.8 | 86% | 0.385 | 9% |
| 123 | 0.63 | 500 | 2.8 | 86% | 0.385 | 9% |
| 124 | 0.61 | 500 | 2.8 | 86% | 0.385 | 9% |
| 125 | 0.59 | 400 | 2.8 | 86% | 0.385 | 9% |
| 126 | 0.62 | 300 | 2.8 | 86% | 0.385 | 9% |
| 127 | 0.59 | 200 | 2.8 | 86% | 0.385 | 9% |
| 128 | 0.58 | 500 | 2.8 | 86% | 0.385 | 9% |
| 129 | 0.63 | 500 | 2.0 | 81% | 0.385 | 9% |
| 130 | 0.62 | 500 | 1.8 | 79% | 0.385 | 9% |

TABLE 2

| | Characteristics of steel sheet | | B50(T) | | | | | | | | | |
|---|---|---|---|---|---|---|---|---|---|---|---|---|
| No. | {100}<011> | Sheet thickness | B50D1 | B50D2 | B50L | B50C | Formula (2) | Formula (3) | Formula (4) | Formula (5) | Formula (6) | Note |
| 101 | 14.6 | 0.35 | 1.809 | 1.812 | 1.558 | 1.550 | Satisfied | Satisfied | Satisfied | Not satisfied | Satisfied | Present Invention |
| 102 | 14.9 | 0.35 | 1.814 | 1.809 | 1.563 | 1.553 | Satisfied | Satisfied | Satisfied | Not satisfied | Satisfied | Present Invention |
| 103 | 15.2 | 0.35 | 1.809 | 1.814 | 1.563 | 1.547 | Satisfied | Satisfied | Satisfied | Not satisfied | Satisfied | Present Invention |
| 104 | 15.1 | 0.35 | 1.807 | 1.814 | 1.564 | 1.547 | Satisfied | Satisfied | Satisfied | Not satisfied | Satisfied | Present Invention |
| 105 | 15.3 | 0.35 | 1.813 | 1.807 | 1.558 | 1.548 | Satisfied | Satisfied | Satisfied | Not satisfied | Satisfied | Present Invention |
| 106 | 14.8 | 0.35 | 1.814 | 1.808 | 1.556 | 1.547 | Satisfied | Satisfied | Satisfied | Not satisfied | Satisfied | Present Invention |
| 107 | 14.6 | 0.35 | 1.807 | 1.807 | 1.559 | 1.547 | Satisfied | Satisfied | Satisfied | Not satisfied | Satisfied | Present Invention |
| 108 | 0.3 | 0.35 | 1.548 | 1.551 | 1.633 | 1.583 | Not satisfied | Not satisfied | Not satisfied | Not satisfied | Not satisfied | Comparative Example |
| 109 | 15.4 | 0.35 | 1.792 | 1.787 | 1.548 | 1.554 | Satisfied | Satisfied | Satisfied | Not satisfied | Not satisfied | Present Invention |
| 110 | 25.1 | 0.35 | 1.846 | 1.851 | 1.538 | 1.532 | Satisfied | Satisfied | Satisfied | Satisfied | Satisfied | Present Invention |
| 111 | 19.8 | 0.35 | 1.818 | 1.817 | 1.547 | 1.540 | Satisfied | Satisfied | Satisfied | Not satisfied | Satisfied | Present Invention |
| 112 | 3.1 | 0.35 | 1.684 | 1.678 | 1.586 | 1.587 | Not satisfied | Satisfied | Not satisfied | Not satisfied | Not satisfied | Comparative Example |
| 113 | 34.6 | 0.35 | 1.861 | 1.862 | 1.551 | 1.551 | Satisfied | Satisfied | Satisfied | Not satisfied | Not satisfied | Comparative Example |
| 114 | 20.0 | 0.25 | 1.812 | 1.813 | 1.541 | 1.526 | Satisfied | Satisfied | Satisfied | Not satisfied | Satisfied | Present Invention |
| 115 | 19.7 | 0.10 | 1.839 | 1.843 | 1.586 | 1.590 | Satisfied | Satisfied | Satisfied | Not satisfied | Satisfied | Present Invention |
| 116 | 7.0 | 0.35 | 1.727 | 1.730 | 1.528 | 1.529 | Satisfied | Satisfied | Satisfied | Not satisfied | Not satisfied | Present Invention |
| 117 | 12.0 | 0.35 | 1.773 | 1.767 | 1.538 | 1.532 | Satisfied | Satisfied | Satisfied | Not satisfied | Not satisfied | Present Invention |
| 118 | 15.0 | 0.35 | 1.784 | 1.778 | 1.543 | 1.531 | Satisfied | Satisfied | Satisfied | Not satisfied | Not satisfied | Present Invention |
| 119 | 14.6 | 0.35 | 1.786 | 1.785 | 1.540 | 1.532 | Satisfied | Satisfied | Satisfied | Not satisfied | Not satisfied | Present Invention |
| 120 | 14.6 | 0.35 | 1.783 | 1.788 | 1.541 | 1.528 | Satisfied | Satisfied | Satisfied | Not satisfied | Not satisfied | Present Invention |

TABLE 2-continued

| | Characteristics of steel sheet | | B50(T) | | | | | | | | | |
|---|---|---|---|---|---|---|---|---|---|---|---|---|
| No. | {100}<011> | Sheet thickness | B50D1 | B50D2 | B50L | B50C | Formula (2) | Formula (3) | Formula (4) | Formula (5) | Formula (6) | Note |
| 121 | 15.3 | 0.35 | 1.784 | 1.785 | 1.539 | 1.531 | Satisfied | Satisfied | Satisfied | Not satisfied | Not satisfied | Present Invention |
| 122 | 14.7 | 0.35 | 1.783 | 1.785 | 1.539 | 1.533 | Satisfied | Satisfied | Satisfied | Not satisfied | Not satisfied | Present Invention |
| 123 | 15.1 | 0.35 | 1.786 | 1.787 | 1.541 | 1.529 | Satisfied | Satisfied | Satisfied | Not satisfied | Not satisfied | Present Invention |
| 124 | 15.1 | 0.35 | 1.785 | 1.785 | 1.538 | 1.527 | Satisfied | Satisfied | Satisfied | Not satisfied | Not satisfied | Present Invention |
| 125 | 12.2 | 0.35 | 1.768 | 1.772 | 1.541 | 1.531 | Satisfied | Satisfied | Satisfied | Not satisfied | Not satisfied | Present Invention |
| 126 | 11.2 | 0.35 | 1.762 | 1.765 | 1.536 | 1.531 | Satisfied | Satisfied | Satisfied | Not satisfied | Not satisfied | Present Invention |
| 127 | 6.9 | 0.35 | 1.734 | 1.735 | 1.517 | 1.529 | Satisfied | Satisfied | Satisfied | Not satisfied | Not satisfied | Present Invention |
| 128 | 15.2 | 0.35 | 1.772 | 1.774 | 1.539 | 1.519 | Satisfied | Satisfied | Satisfied | Not satisfied | Not satisfied | Present Invention |
| 129 | 10.4 | 0.35 | 1.746 | 1.746 | 1.532 | 1.521 | Satisfied | Satisfied | Satisfied | Not satisfied | Not satisfied | Present Invention |
| 130 | 5.9 | 0.35 | 1.731 | 1.736 | 1.519 | 1.528 | Satisfied | Satisfied | Satisfied | Not satisfied | Not satisfied | Present Invention |

Underlined values in Table 1 and Table 2 indicate that the conditions deviate from the scope of the present invention. In all of No. 101 to No. 107, No. 109 to No. 111, and No. 114 to No. 130, which were invention examples, the magnetic flux densities B50 were favorable values both in the 45° direction and on the whole circumference average. However, in No. 116 and No. 127, since the coiling temperatures were outside the appropriate range, the magnetic flux densities B50 were slightly low. In No. 129 and No. 130, since the rolling reductions of the cold rolling were small, the magnetic flux densities B50 were slightly low compared with No. 118 in which the components and the coiling temperature were the same. On the other hand, in No. 108, which was a comparative example, since the Si concentration was high, the value of the left side of the formula was 0 or less, and the composition did not undergo a-y transformation, the magnetic flux densities B50 were all low. In No. 112, which was a comparative example, since the skin pass rolling reduction was decreased, the {100}<011> strength was less than 5, and all of the magnetic flux densities B50 were low. No. 113, which was a comparative example, the {100}<011> strength became 30 or more, which deviated from the present invention. In No. 113, since the thickness of the hot-rolled sheet was 7 mm, there was a drawback of an operation difficulty.

Second Example

Molten steel was cast, thereby producing ingots having components shown in Table 3 below. After that, the produced ingots were hot-rolled by being heated up to 1150° C. and rolled such that the sheet thicknesses became 2.5 mm. In addition, after the end of finish rolling, the hot-rolled steel sheets were coiled. The finishing temperatures in a stage of the final pass of the finish rolling at this time were 830° C. and were all temperatures higher than the Ar1 temperature.

Next, the hot-rolled steel sheets were pickled to remove scales and cold-rolled until the sheet thicknesses became 0.385 mm. In addition, process annealing was performed in a non-oxidizing atmosphere, and the temperatures in the process annealing were controlled such that the recrystallization rates became 85%. Next, a second round of cold rolling (skin pass rolling) was performed until the sheet thicknesses became 0.35 mm.

Next, in order to investigate the magnetic characteristics, after the second round of cold rolling (skin pass rolling), final annealing was performed at 800° C. for 30 seconds to produce 55 mm×55 mm samples by shearing, then, stress relief annealing was performed at 800° C. for two hours, and the magnetic flux densities B50 and the iron losses W10/400 were measured. The magnetic flux densities B50 were measured in the same order as in the first example. Incidentally, the iron loss W10/400 was measured as an energy loss (W/kg) that was caused in a sample when an alternating-current magnetic field of 400 Hz was applied such that the maximum magnetic flux density became 1.0 T. As the iron loss, the average value of the results measured at 0°, 45°, 90°, and 135° with respect to the rolling direction was employed.

TABLE 3

| | Component (wt %) | | | | | | | | | | |
|---|---|---|---|---|---|---|---|---|---|---|---|
| No. | C | Si | sol-Al | S | N | Mn | Sn | Sb | P | Mg | Ca |
| 201 | 0.0006 | 2.49 | 0.010 | 0.0022 | 0.0019 | 3.10 | — | — | — | — | — |
| 202 | 0.0010 | 2.53 | 0.007 | 0.0022 | 0.0017 | 3.07 | 0.052 | — | — | — | — |
| 203 | 0.0009 | 2.50 | 0.014 | 0.0019 | 0.0019 | 3.12 | — | 0.053 | — | — | — |
| 204 | 0.0010 | 2.52 | 0.009 | 0.0018 | 0.0022 | 3.11 | — | — | 0.048 | — | — |
| 205 | 0.0010 | 2.47 | 0.007 | 0.0023 | 0.0024 | 3.14 | — | — | — | 0.0051 | — |
| 206 | 0.0007 | 2.48 | 0.009 | 0.0018 | 0.0022 | 3.11 | — | — | — | — | 0.0053 |
| 207 | 0.0010 | 2.47 | 0.012 | 0.0019 | 0.0017 | 3.09 | — | — | — | — | — |

TABLE 3-continued

| | | | | | | | | | | |
|---|---|---|---|---|---|---|---|---|---|---|
| 208 | 0.0009 | 2.54 | 0.014 | 0.0017 | 0.0016 | 3.12 | — | — | — | — |
| 209 | 0.0011 | 2.48 | 0.010 | 0.0023 | 0.0018 | 3.12 | — | — | — | — |
| 210 | 0.0008 | 2.50 | 0.011 | 0.0021 | 0.0020 | 3.11 | — | — | — | — |
| 211 | 0.0012 | 2.49 | 0.007 | 0.0017 | 0.0020 | 3.14 | — | — | — | — |
| 212 | 0.0009 | 2.49 | 0.008 | 0.0020 | 0.0022 | 3.13 | — | — | — | — |
| 213 | 0.0012 | 2.46 | 0.011 | 0.0019 | 0.0016 | 3.07 | — | — | — | — |
| 214 | 0.0008 | 2.52 | 0.011 | 0.0021 | 0.0021 | 3.10 | — | — | — | — |

| | Component (wt %) | | | | | | | | Formula |
|---|---|---|---|---|---|---|---|---|---|
| No. | Sr | Ba | Ce | La | Nd | Pr | Zn | Cd | (1) |
| 201 | — | — | — | — | — | — | — | — | 0.60 |
| 202 | — | — | — | — | — | — | — | — | 0.54 |
| 203 | — | — | — | — | — | — | — | — | 0.60 |
| 204 | — | — | — | — | — | — | — | — | 0.58 |
| 205 | — | — | — | — | — | — | — | — | 0.66 |
| 206 | — | — | — | — | — | — | — | — | 0.62 |
| 207 | 0.0051 | — | — | — | — | — | — | — | 0.61 |
| 208 | — | 0.0047 | — | — | — | — | — | — | 0.56 |
| 209 | — | — | 0.0049 | — | — | — | — | — | 0.63 |
| 210 | — | — | — | 0.0052 | — | — | — | — | 0.60 |
| 211 | — | — | — | — | 0.0051 | — | — | — | 0.64 |
| 212 | — | — | — | — | — | 0.0048 | — | — | 0.63 |
| 213 | — | — | — | — | — | — | 0.0054 | — | 0.59 |
| 214 | — | — | — | — | — | — | — | 0.0052 | 0.57 |

TABLE 4

| | Characteristics of steel sheet | | Magnetic characteristics after annealing at 800° C. for two hours | | | | Whole circumference | |
|---|---|---|---|---|---|---|---|---|
| No. | {100}<011> | Sheet thickness | B50D1 | B50D2 | B50L | B50C | average W10/400 | Note |
| 201 | 14.7 | 0.35 | 1.811 | 1.809 | 1.561 | 1.553 | 15.28 | Present Invention |
| 202 | 15.1 | 0.35 | 1.824 | 1.820 | 1.574 | 1.564 | 15.30 | Present Invention |
| 203 | 15.1 | 0.35 | 1.822 | 1.822 | 1.568 | 1.561 | 15.33 | Present Invention |
| 204 | 15.4 | 0.35 | 1.818 | 1.821 | 1.567 | 1.559 | 15.32 | Present Invention |
| 205 | 15.2 | 0.35 | 1.809 | 1.810 | 1.561 | 1.551 | 14.89 | Present Invention |
| 206 | 14.7 | 0.35 | 1.808 | 1.812 | 1.562 | 1.551 | 14.90 | Present Invention |
| 207 | 14.6 | 0.35 | 1.812 | 1.807 | 1.556 | 1.550 | 14.93 | Present Invention |
| 208 | 15.3 | 0.35 | 1.813 | 1.809 | 1.557 | 1.549 | 14.91 | Present Invention |
| 209 | 15.3 | 0.35 | 1.812 | 1.808 | 1.562 | 1.554 | 14.89 | Present Invention |
| 210 | 14.8 | 0.35 | 1.809 | 1.810 | 1.562 | 1.547 | 14.92 | Present Invention |
| 211 | 14.9 | 0.35 | 1.813 | 1.808 | 1.563 | 1.551 | 14.88 | Present Invention |
| 212 | 15.2 | 0.35 | 1.813 | 1.810 | 1.563 | 1.548 | 14.91 | Present Invention |
| 213 | 14.8 | 0.35 | 1.813 | 1.810 | 1.563 | 1.553 | 14.94 | Present Invention |
| 214 | 15.3 | 0.35 | 1.811 | 1.807 | 1.564 | 1.553 | 14.88 | Present Invention |

No. 201 to No. 214 were all invention examples and all had favorable magnetic characteristics. In particular, the magnetic flux densities B50 were higher in No. 202 to No. 204 than in No. 201, No. 205 to No. 214, and the iron losses W10/400 were lower in No. 205 to No. 214 than in No. 201 to No. 204.

Hitherto, the present invention has been described together with a variety of embodiments, but the present invention is not limited only to these embodiments and can be modified or the like within the scope of the present invention.

In the above description, the case where the operating condition is the torque proportion has been described, but the operating condition is not limited to this case, and the operating condition may be the rotation speed proportion or may be the torque proportion for each rotation speed proportion.

INDUSTRIAL APPLICABILITY

According to the present invention, it is possible to reduce a variation in the magnetic flux density to suppress the iron loss. Therefore, the present disclosure is highly industrially applicable.

BRIEF DESCRIPTION OF THE REFERENCE SYMBOLS

100: Rotary electric machine
110: Rotor
120: Stator
121a to 121p: Teeth
122: York
130: Rotating shaft
400: Motor
410: Rotor
411: Permanent magnet
421: Stator core
422: Coil
501a to 501m: Stator
1600: Motor
1610: Rotor
1621: Stator core
1622: Coil
1701a to 1701p: Stator
2700: Stator core design device
2701: Operation data acquisition unit
2702: Operating condition/operating proportion specifying unit
2703: Average magnetic flux density acquisition unit
2704: Evaluation magnetic flux density calculation unit
2705: Average magnetic field strength calculation unit
2706: Teeth magnetic flux density acquisition unit
2707: Teeth width determination unit
2708: Stator core design unit

The invention claimed is:
1. A stator core comprising:
a plurality of laminated electrical steel sheets,
wherein, among a plurality of teeth of the stator core, widths of teeth along a direction in which magnetic characteristics are high are narrower than widths of teeth along a direction in which the magnetic characteristics are low,
wherein the stator core is configured by laminating rolled electrical steel sheets,
the electrical steel sheet has
a chemical composition containing, by mass %,
C: 0.0100% or less,
Si: 1.50% to 4.00%,
sol. Al: 0.0001% to 1.0%,
S: 0.0100% or less,
N: 0.0100% or less,
one or more selected from Mn, Ni, Co, Pt, Pb, Cu and Au: 2.50% to 5.00% in total,
Sn: 0.000% to 0.400%,
Sb: 0.000% to 0.400%
P: 0.000% to 0.400%, and
one or more selected from Mg, Ca, Sr, Ba, Ce, La, Nd, Pr, Zn and Cd: 0.0000% to 0.0100% in total are contained,
in which, when a Mn content (mass %) is indicated by (Mn), a Ni content (mass %) is indicated by (Ni), a Co content (mass %) is indicated by (Co), a Pt content (mass %) is indicated by (Pt), a Pb content (mass %) is indicated by (Pb), a Cu content (mass %) is indicated by (Cu), an Au content (mass %) is indicated by (Au), a Si content (mass %) is indicated by (Si), and a sol. Al content (mass %) is indicated by (sol. Al), Formula (1) below is satisfied, and
a remainder includes Fe and impurities,
when a value of B50 in a rolling direction is indicated by B50L, a value of B50 in a direction inclined by 45° from the rolling direction is indicated by B50D1, a value of B50 in a direction inclined by 90° from the rolling direction is indicated by B50C, and a value of B50 in a direction inclined by 135° from the rolling direction is indicated by B50D2, Formula (2) and Formula (3) below are satisfied, an X-ray random intensity ratio in {100}<011> is 5 or more and less than 30, and a sheet thickness is 0.50 mm or less,
the direction in which the magnetic characteristics are high is a direction at an angle of 45° from the rolling direction, and the direction in which the magnetic characteristics are low is directions at angle of 0° and 90° from the rolling direction, and
widths of teeth along a direction at an angle of 45° from the rolling direction are narrower than widths of teeth along a direction at an angle of 0° from the rolling direction and widths of teeth along a direction at an angle of 90° from the rolling direction,

$$((Mn)+(Ni)+(Co)+(Pt)+(Pb)+(Cu)+(Au))-((Si)+(sol.Al))>0\% \quad (1),$$

$$(B50D1+B50D2)/2>1.7T \quad (2) \text{ and}$$

$$(B50D1+B50D2)/2>(B50L+B50C)/2 \quad (3).$$

2. The stator core according to claim 1,
wherein, in the teeth of the stator core,
a product of the width of the tooth of the stator core and a magnetic flux density in the tooth when the stator core is excited with a predetermined magnetic field strength is substantially constant in each tooth.

3. The stator core according to claim 2,
wherein the stator core is configured by laminating rolled electrical steel sheets,
the electrical steel sheet has
a chemical composition containing, by mass %,
C: 0.0100% or less,
Si: 1.50% to 4.00%,
sol. Al: 0.0001% to 1.0%,
S: 0.0100% or less,
N: 0.0100% or less,
one or more selected from Mn, Ni, Co, Pt, Pb, Cu and Au: 2.50% to 5.00% in total,
Sn: 0.000% to 0.400%,
Sb: 0.000% to 0.400%,
P: 0.000% to 0.400%, and
one or more selected from Mg, Ca, Sr, Ba, Ce, La, Nd, Pr, Zn and Cd: 0.0000% to 0.0100% in total are contained,
in which, when a Mn content (mass %) is indicated by (Mn), a Ni content (mass %) is indicated by (Ni), a Co content (mass %) is indicated by (Co), a Pt content (mass %) is indicated by (Pt), a Pb content (mass %) is indicated by (Pb), a Cu content (mass %) is indicated by (Cu), an Au content (mass %) is indicated by (Au), a Si content (mass %) is indicated by (Si), and a sol, Al content (mass %) is indicated by (sol, Al), Formula (1) below is satisfied, and a remainder includes Fe and impurities, when a value of B50 in a rolling direction is indicated by B50L, a value of B50 in a direction inclined by 45° from the rolling direction is indicated by B50D1, a value of B50 in a direction inclined by 90° from the rolling direction is indicated by B50C, and a value of B50 in a direction inclined by 135° from the rolling direction is indicated by B50D2, Formula (2) and Formula (3) below are satisfied, an X-ray random intensity ratio in {100}<011> is 5 or more and less than 30, and a sheet thickness is 0.50 mm or less, the direction in which the magnetic characteristics are high is a direction at an angle of 45° from the rolling direction, and the direction in which the magnetic characteristics are low is directions at angle of 0° and 90° from the rolling direction, and widths of teeth along a direction at an angle of 45° from the rolling direction are narrower than widths of teeth along a direction at an angle of 0° from the rolling direction and widths of teeth along a direction at an angle of 90° from the rolling direction, $$((Mn)+(Ni)+(Co)+(Pt)+(Pb)+(Cu)+(Au))-((Si)+(sol, Al))>0\% \quad (1),$$

$$(B50D1+B50D2)/2>1.7T \quad (2), \text{ and}$$

$$(B50D1+B50D2)/2>(B50L+B50C)/2 \quad (3).$$

4. A rotary electric machine comprising:
the stator core according to claim 2.

5. The stator core according to claim 1,
wherein Formula (4) below is satisfied, $$(B50D1+B50D2)/2>1.1\times(B50L+B50C)/2 \quad (4).$$

6. A rotary electric machine comprising:
the stator core according to claim 4.

7. The stator core according to claim 1,
wherein Formula (5) below is satisfied, $$(B50D1+B50D2)/2>1.2\times(B50L+B50C)/2 \quad (5).$$

8. A rotary electric machine comprising:
the stator core according to claim 5.

9. The stator core according to claim 1
wherein Formula (6) below is satisfied, $$(B50D1+B50D2)/2>1.8T \quad (6).$$

10. A rotary electric machine comprising:
the stator core according to claim 6.

11. A design method for a stator core having laminated electrical steel sheets, the method comprising:

a teeth magnetic flux density acquiring process of acquiring information on magnetic flux densities in teeth when excited with a predetermined magnetic field strength;

a determination process of determining widths of the teeth of the stator core such that a product of the width of the tooth of the stator core and the magnetic flux density in the tooth acquired by the teeth magnetic flux density acquiring process becomes substantially constant in each tooth;

an operation data acquiring process of acquiring operation data of a rotary electric machine including the stator core in a case where the rotary electric machine is operated;

a specifying process of specifying an operating condition having a highest proportion of an operating time among a plurality of operating conditions based on the operation data acquired by the operation data acquiring process;

an average magnetic flux density acquiring process of acquiring information on an average magnetic flux density in the tooth corresponding to the operating condition having the highest proportion specified by the specifying process; and an average magnetic field strength calculation process of calculating an average magnetic field strength in the tooth from the information on the average magnetic flux density in the tooth acquired by the average magnetic flux density acquiring process, wherein, in the teeth magnetic flux density acquiring process, information on magnetic flux densities in the teeth when excited with the average magnetic field strength calculated by the average magnetic field strength calculation process is acquired.

12. The design method for a stator core according to claim 11,
wherein, in the operation data acquiring process,
at least any operation data of planned data and actual data of the rotary electric machine including the stator core is acquired.

13. A rotary electric machine comprising:
the stator core according to claim 1.

14. A rotary electric machine comprising:
the stator core according to claim 1.

15. A design method for a stator core having laminated electrical steel sheets, the method comprising:

a teeth magnetic flux density acquiring process of acquiring information on magnetic flux densities in teeth when excited with a predetermined magnetic field strength;

a determination process of determining widths of the teeth of the stator core such that a product of the width of the tooth of the stator core and the magnetic flux density in the tooth acquired by the teeth magnetic flux density acquiring process becomes substantially constant in each tooth;

an operation data acquiring process of acquiring operation data of a rotary electric machine including the stator core in a case where the rotary electric machine is operated;

a specifying process of specifying a proportion of an operating time for each of a plurality of operating conditions based on the operation data acquired by the operation data acquiring process;

an average magnetic flux density acquiring process of acquiring information on an average magnetic flux density in the tooth corresponding to each of the plurality of operating conditions; and an average magnetic field strength calculation process of calculating an average magnetic field strength in the tooth for each of the plurality of operating conditions from the information on the average magnetic flux density in the tooth corresponding to each of the plurality of operating conditions acquired by the average magnetic flux density acquiring process, wherein, in the teeth magnetic flux density acquiring process, information on magnetic flux densities in the teeth for each of the plurality of operating conditions when excited with the average magnetic field strength for each of the plurality of operating conditions calculated by the average magnetic field strength calculation process is acquired, in the determination process, the widths of the teeth are calculated for each of the plurality of operating conditions such that the product of the width of the tooth of the stator core and the magnetic flux density in the tooth acquired by the teeth magnetic flux density acquiring process becomes substantially constant in each tooth, and the calculated widths of the teeth for each of the plurality of operating conditions are weighted based on the proportions of the operating times specified by the specifying process to determine widths of the teeth after weighting.

16. The design method for a stator core according to claim 15, wherein, in the operation data acquiring process, at least any operation data of planned data and actual data of the rotary electric machine including the stator core is acquired.

17. A design method for a stator core having laminated electrical steel sheets, the method comprising:

a teeth magnetic flux density acquiring process of acquiring information on magnetic flux densities in teeth when excited with a predetermined magnetic field strength;

a determination process of determining widths of the teeth of the stator core such that a product of the width of the tooth of the stator core and the magnetic flux density in the tooth acquired by the teeth magnetic flux density acquiring process becomes substantially constant in each tooth;

an operation data acquiring process of acquiring operation data of a rotary electric machine including the stator core in a case where the rotary electric machine is operated;

a specifying process of specifying a proportion of an operating time for each of a plurality of operating conditions based on the operation data acquired by the operation data acquiring process;

an average magnetic flux density acquiring process of acquiring information on an average magnetic flux density in the tooth corresponding to each of the plurality of operating conditions;

an evaluation magnetic flux density calculation process of calculating an evaluation magnetic flux density in the tooth weighted based on the proportion of the operating time specified by the specifying process from the information on the average magnetic flux density in the tooth corresponding to each of the plurality of operating conditions acquired by the average magnetic flux density acquiring process; and an average magnetic field strength calculation process of calculating an average magnetic field strength in the tooth from the evaluation magnetic flux density of the tooth calculated by the evaluation magnetic flux density calculation process, wherein, in the teeth magnetic flux density acquiring process, information on magnetic flux densities in the teeth when excited with the calculated average magnetic field strength in the teeth calculated in the average magnetic field strength calculation process is acquired.

18. The design method for a stator core according to claim 17, wherein, in the operation data acquiring process, at least any operation data of planned data and actual data of the rotary electric machine including the stator core is acquired.

* * * * *